United States Patent [19]
Saito et al.

[11] Patent Number: 6,116,840
[45] Date of Patent: Sep. 12, 2000

[54] COMPONENT SUPPLY APPARATUS

[75] Inventors: Koji Saito; Taro Yasuda; Kazushige Koyama; Jinichi Ohkawara; Atsuo Kamimura, all of Tokyo, Japan

[73] Assignee: Taiyo Yuden Co., Ltd., Tokyo, Japan

[21] Appl. No.: 09/376,279

[22] Filed: Aug. 18, 1999

[30] Foreign Application Priority Data

Aug. 21, 1998 [JP] Japan .................................. 10-235670

[51] Int. Cl.⁷ .......................... H05K 13/02; B65G 47/14; B65G 47/82
[52] U.S. Cl. .......................... 414/414; 414/403; 198/390; 198/396; 198/406; 198/443; 198/456; 29/740; 29/759; 221/171; 221/181; 221/292
[58] Field of Search ..................... 414/403, 404, 414/414, 415, 418; 198/383, 389, 390, 396, 406, 443, 453, 456; 29/740, 759; 221/171, 181, 195, 197, 200, 289, 290, 292, 298

[56] References Cited

U.S. PATENT DOCUMENTS

| | | | |
|---|---|---|---|
| 4,201,313 | 5/1980 | Kirsch | ...................................... 221/171 |
| 4,459,743 | 7/1984 | Watanabe et al. | ................... 221/181 X |
| 4,460,108 | 7/1984 | Noda et al. | ............................. 29/759 X |
| 5,513,739 | 5/1996 | Berg | ...................................... 198/390 X |
| 5,525,023 | 6/1996 | Soga et al. | ............................... 414/414 |
| 5,636,725 | 6/1997 | Saito et al. | ............................... 198/396 |
| 6,032,783 | 3/2000 | Saito et al. | ............................... 198/390 |

FOREIGN PATENT DOCUMENTS

H6-232596  8/1994  Japan .

Primary Examiner—Robert P. Olszewski
Assistant Examiner—Gerald J. O'Connor
Attorney, Agent, or Firm—Lowe Hauptman Gopstein Gilman & Berner

[57] ABSTRACT

A component supply apparatus includes a rectangular cross-sectional component passage which can house a plurality of chip components in a longitudinal direction, and at a first side surface of the tip of this component passage a rectangular-shaped component discharge opening is formed, and at a second side surface opposing the first side surface of the tip of the component passage a rectangular-shaped pusher insertion opening is formed. Inserting the pusher into the component passage through the pusher insertion opening enables a forefront electronic component to be pushed by the pusher and be discharged outside from the component discharge opening in a predetermined direction.

32 Claims, 23 Drawing Sheets

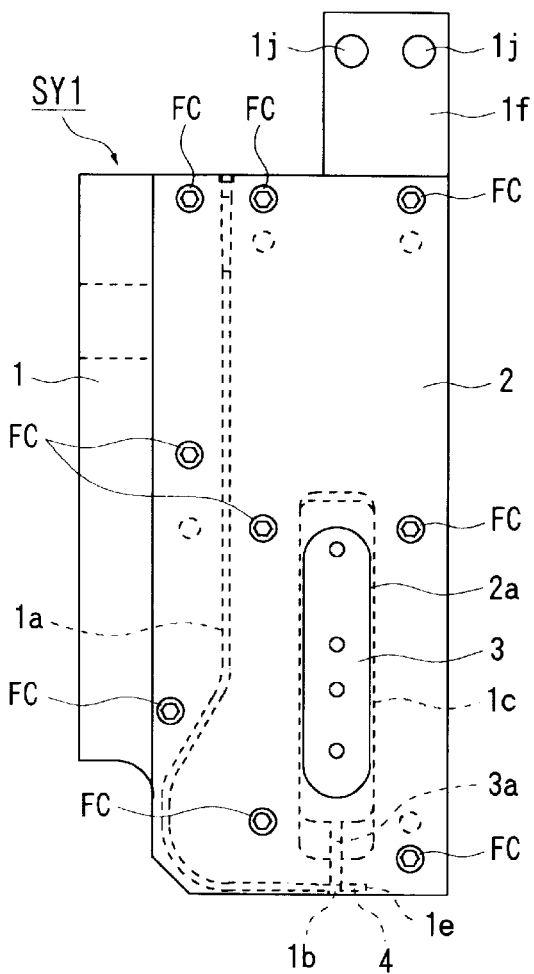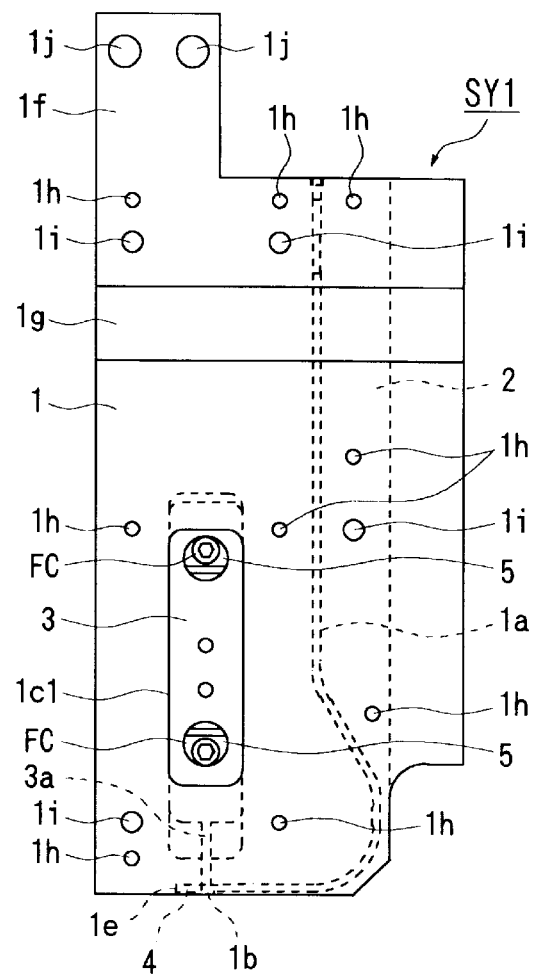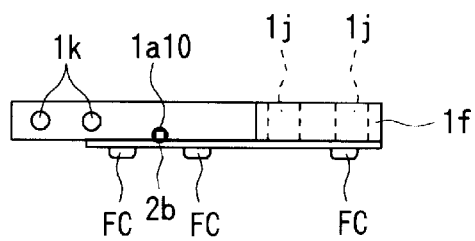

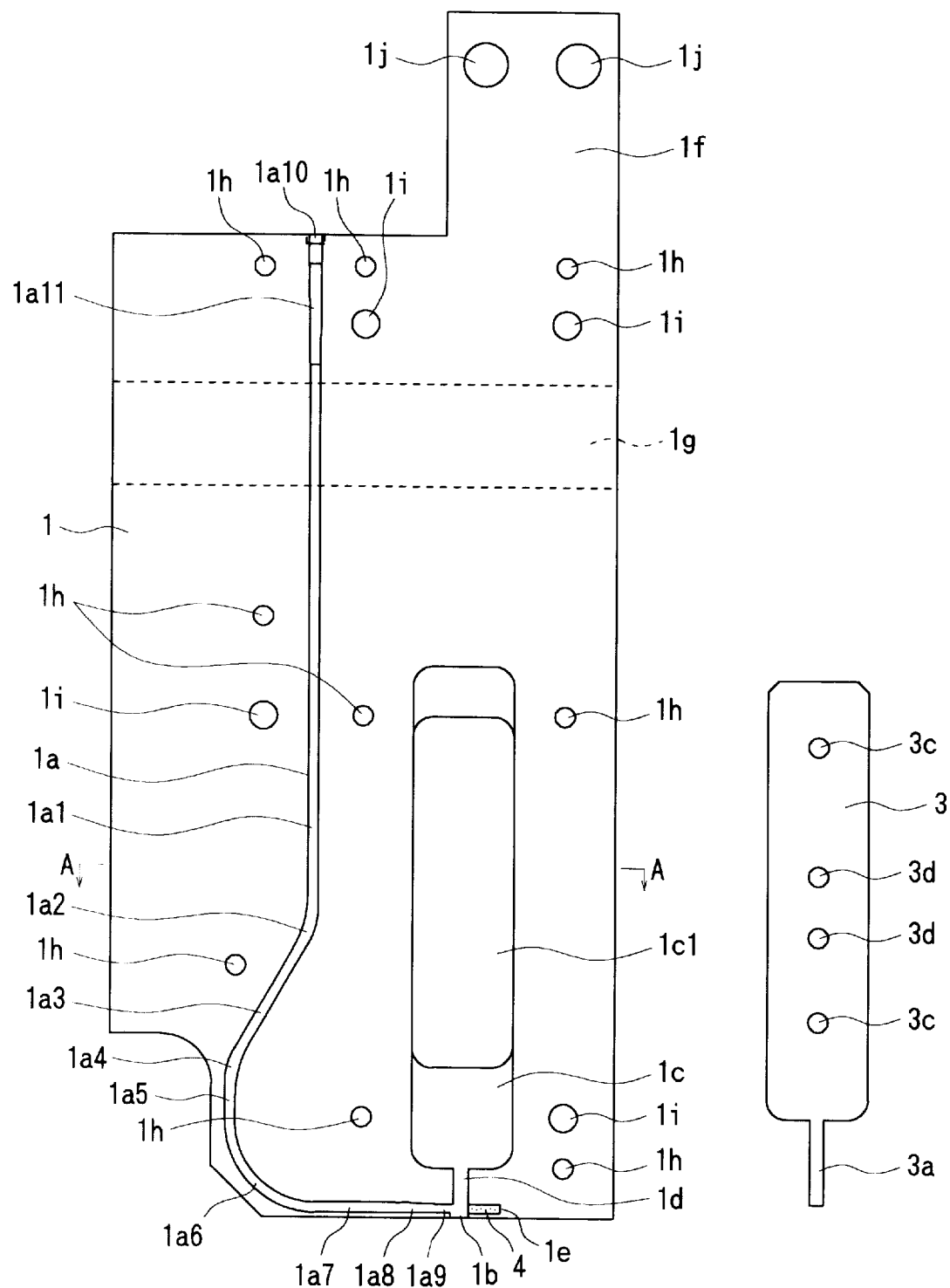

COMPONENT SUPPLY APPARATUS

BACKGROUND OF THE INVENTION

1. Field of the Invention

This invention relates to a component supply apparatus to supply electronic components in a bulk state such as chip components or the like one by one.

2. Description of the Related Art

Japanese Patent Application Laid-Open No. Hei 6-232596 discloses an apparatus which supplies electronic components in a bulk state.

This apparatus has a belt for transferring chip components, a ratchet mechanism for moving the belt intermittently, a grooved cover for arranging the chip components on the belt in order, a stopper for bringing the chip components being transferred on the belt to a halt. The belt repeats a move and a halt alternately, and at the time of movement the forefront chip component contacts the stopper, and at the time of a halt the forefront chip component is taken out outside by a suction nozzle.

When mounting one electronic component on a circuit substrate with involvement of the aforementioned conventional apparatus, it is necessary to move back and forth between the component extracting position and the component mounting position, and further to move up and down the suction nozzle respectively at the component extracting position and the component mounting position. That is, time corresponding with the aforementioned nozzle operation becomes necessary each time one electronic component is mounted on the circuit substrate.

It becomes possible to accelerate the aforementioned component mounting time by expediting the nozzle operation speed. However, acceleration of the component mounting time has its own limit, because the trouble that the electric component drops out during the operation occurs when expediting the nozzle operation speed extremely. In this connection, this inconvenience occurs when an electric component is inserted within a housing recess of the component wrapping tape as well.

Especially, in recent years, speeding up component mounting on substrate and component insertion within the housing recess of the component wrapping tape is wanted, thus apparatus with such supplying performance that can follow these high speeds.

SUMMARY OF THE INVENTION

The object of the present invention is to provide a novel component supply apparatus which is capable of implementing a component mounting on a substrate and a component insertion into a housing recess of a component wrapping tape in a high cycle.

To attain the aforementioned object, a component supply apparatus related to the present invention comprises: a component passage having rectangular cross-section which allows a plurality of electronic components to be housed in a state of being arranged in a longitudinal direction and allows the housed electronic components to be moved downward by their own weights; a rectangular-shaped component discharge opening having the same width as the component passage, said component discharge opening being formed at a first side surface of a tip of the component passage; a rectangular-shaped pusher insertion opening having the same width as the component passage, said pusher insertion opening being formed at a second side surface opposing the first side surface of the tip of the component passage; and a movable pusher having a tip portion fitted with the pusher insertion opening, wherein a surface of the component discharge opening located at the same side of an end surface of the tip of the component passage and a surface of the pusher insertion opening located at the same side of the end surface of the tip of the component passage are on the same plane as the end surface of the tip of the component passage.

This component supply apparatus can house in the component passage a plurality of electronic components in a state of being arranged in a longitudinal direction. The electric components housed in the component passage moves downward by their own weights in a state of being arranged, then, a forefront electronic component contacts with an end surface of the tip of the component passage. The component discharge opening is formed at the first side surface of the tip of the component passage, the pusher insertion opening is formed at the second side surface opposing the first side surface of the tip of the component passage, thus inserting the pusher into the component passage through the pusher insertion opening enables the forefront electronic component to be pushed by the pusher and be discharged outside from the component discharge opening in a predetermined direction. Getting the pusher back after component discharge, the entire succeeding electronic components move downward by their own weights in the component passage, and a next forefront electronic component contacts with the end surface of the tip of the component passage again, and get in the discharge stand-by condition.

According to this component supply apparatus, reciprocating the pusher can discharge outside the forefront electronic component in the component passage sequentially from the component discharge opening in a predetermined direction. Therefore, disposing a circuit substrate near the component discharge opening can implement component mounting on the circuit substrate in a high speed cycle by proceeding with component discharge while the relative position between the apparatus and the circuit substrate is being changed. Moreover, disposing a component wrapping tape near the component discharge opening implement component insertion in a housing recess of a component wrapping tape in a high cycle by proceeding with component discharge while the relative position between the apparatus and the component wrapping tape is being changed.

Furthermore, since the surface of the component discharge opening located at the same side of the end surface of the tip of the component passage and the surface of the pusher insertion opening located at the same side of the end surface of the tip of the component passage are on the same plane as the end surface of the tip of the component passage, even when the component discharge cycle is sped up, the movement of the pusher in accordance with component discharge and the movement of electronic components can be made smoothly, and also can prevent the electronic component posture from falling into disorder during the course of component discharge.

In addition, to attain the aforementioned object, a component supply apparatus related to the present invention comprises: a component passage having rectangular cross-section which allows a plurality of electronic components to be housed in a state of being arranged in a longitudinal direction and allows the housed electronic components to be moved downward by their own weights; a component discharge opening formed at a first side surface of a tip of the component passage; a pusher insertion opening formed at a second side surface opposing the first side surface of the tip of the component passage; and a movable pusher in a tip portion fitted with the pusher insertion opening, wherein the component passage has in halfway of the passage at least two curved portions which have different curving directions each other, and said curved portions have approximately the same rectangular cross-section as the component passage.

This component supply apparatus can house in the component passage a plurality of electronic components in a state of being arranged in a longitudinal direction. The electric components housed in the component passage moves downward by their own weights in a state of being arranged. Since the component passage has in halfway of the passage at least two curved portions which have different curving directions each other, thus the electric components which move downward by their own weights in the component passage contact the inner surface of the curved portions so that their postures are corrected. When the electronic component is shaped as a cubic prism, position correction by the aforementioned contact makes four side surfaces of the electronic component facing the respective four inner surfaces of the component passage.

The forefront electronic component moves downward in the component passage, then, forefront electronic component contacts with an end surface of the tip of the component passage. The component discharge opening is formed at the first side surface of the tip of the component passage, the pusher insertion opening is formed at the second side surface opposing the first side surface of the tip of the component passage, thus inserting the pusher into the component passage through the pusher insertion opening enables the forefront electronic component to be pushed by the pusher and be discharged outside from the component discharge opening in a predetermined direction. Getting the pusher back after component discharge, the entire succeeding electronic components move downward by their own weights in the component passage, and a next forefront electronic component contacts with the end surface of the tip of the component passage again, and get in the discharge stand-by condition.

According to this component supply apparatus, reciprocating the pusher can discharge outside the forefront electronic component in the component passage sequentially from the component discharge opening in a predetermined direction. Therefore, disposing a circuit substrate near the component discharge opening can implement component mounting on the circuit substrate in a high speed cycle by proceeding with component discharge while the relative position between the apparatus and the circuit substrate is being changed. Moreover, disposing a component wrapping tape near the component discharge opening implements component insertion within a housing recess of a component wrapping tape in a high-speed cycle by proceeding with component discharge while the relative position between the apparatus and the component wrapping tape is being changed.

Furthermore, since the component passage has in halfway of the passage at least two curved portions which have different curving directions each other, even when a posture of the component which move downward by their own weights in the component passage is disordered, these electronic components can be caused to contact the inner surface of the curved portions so that their postures are corrected accurately, and this enables the components to move in the component passage extremely smoothly. Therefore, even when the component discharge cycle is sped up, the component movement in the component passage is ensured to follow this component discharge cycle so that the desired component discharge may be conducted well without giving rise to any fault.

The above and other objects, features and advantages of the present invention will become apparent from the following description and accompanying drawings.

BRIEF DESCRIPTION OF THE DRAWINGS

FIG. 1(A) is a front view of a component supply apparatus related to a first embodiment of the present invention;

FIG. 1(B) is a rear view of FIG. 1(A);

FIG. 2 is a top view of FIG. 1(A);

FIG. 3 is a front view of a chute plate as well as a pusher plate shown in FIG. 1(A);

DESCRIPTION OF THE PREFERRED EMBODIMENTS

Figure 4:
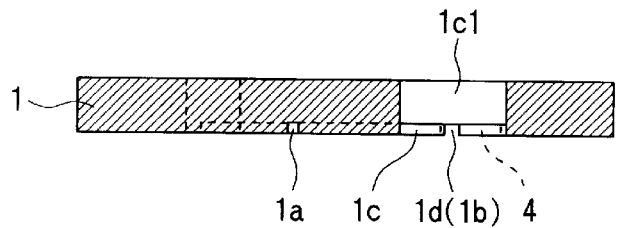
FIG. 4 is a sectional view along a line A—A in FIG. 3.

FIGS. 1 to 13 show a first embodiment of the present invention. Incidentally, in the following description, for the convenience of the description, the front side in FIG. 1(A) is expressed as "front," the rear side as "behind," the left side as "left," and the right side as "right."

The component supply apparatus SY1 shown as the first embodiment mainly comprises, a chute plate 1, a cover plate 2, a pusher plate 3, a permanent magnet 4, and a stopper 5 defining the moving limit of the pusher plate 3.

As shown in FIG. 3, in front of the chute plate 1, formed are a groove 1a for a component passage, a groove 1b for a component discharge opening, a groove 1c for a pusher moving cavity, a groove 1d for a pusher insertion opening, and a groove 1e for a magnet housing cavity. The groove 1a for the component passage comprises the longitudinal first straight portion 1a1, the rightward-curved first curved portion 1a2, the left downward-inclined second straight portion 1a3, the leftward-curved second curved portion 1a4, the longitudinal third straight portion 1a5, the leftward-curved third curved portion 1a6, the lateral fourth straight portion 1a7, the lateral fifth straight portion 1a8, and the lateral sixth straight portion 1a9 in succession. Upward of the first straight portion 1a1, a pipe attachment mouth 1a10 with circle-shaped cross-section larger than the groove of the first straight portion 1a1 is formed, and this pipe attachment mouth 1a10 and the upper end of the first straight portion 1a1 are brought into continuation by a taper portion 1a11. In addition, the inner wall of the groove 1c for the pusher moving cavity has the same width as the groove 1c, and the guide hole 1c1 shorter in length than the groove 1c is through-formed.

Each of the aforementioned respective grooves 1a to 1e is shaped as a square groove in cross-section. In a state where the cover plate 2 is attached to the chute plate 1, the grooves 1a to 1e are respectively assigned to the component passage, the component discharge opening, the pusher moving cavity, the pusher insertion opening, and the magnet housing cavity. Incidentally, in the following description, for the convenience of the description, the component passage is symbolized as 1a, the component discharge opening is symbolized as 1b, the pusher moving cavity is symbolized as 1c, the pusher insertion opening is symbolized as 1d, and the magnet housing cavity is symbolized as 1e.

In addition, at the upper end of the chute plate 1, a stretched portion 1f is provided so as to connect the chute plate 1 with the other members, and further, at the upper rear of the chute plate 1, an oblong guide groove 1g is formed so as to be used when the chute plate 1 is mounted to the other members.

Moreover, on the chute plate 1, nine screw holes 1h are through-formed so as to be used when the cover plate 2 is attached to the chute plate 1, and four screw holes 1i are through-formed so as to be used when the chute plate 1 is attached to the other members. In addition, at the aforementioned stretched portion 1f, a screw insertion hole 1j is through-formed so as to be used when the chute plate 1 is connected with the other members. Moreover, at the upper surface of the chute plate 1, two screw holes 1k are formed so that the pipe holder (refer to a symbol 7 in FIG. 14) may be attached.

The cover plate 2 has the shape shown in FIG. 1(A). On this cover plate 2, an open hole 2a which is slightly smaller in width than the groove 1c for the pusher moving cavity is through-formed, and nine screw insertion holes (not symbolized) are formed so as to correspond with the screw hole 1h of the chute plate 1. In addition, at the position 10 of the cover plate 2 which corresponds with the aforementioned pipe attachment mouth 1a, the recessed portion 2b so as to configure a circle shape together with the pipe attachment mouth 1a10.

The pusher plate 3 has thickness slightly smaller than the pusher moving cavity 1c, and has thin and long tip portion 3a having rectangular cross-section so as to constitute one body at the center of the lower end. In addition, the pusher plate 3 has two screw holes 3c which formed up and down respectively at a distance so that the stopper 5 may be attached there, and between those screw holes 3c two screw holes 3d are formed so that the bracket (refer to a symbol 6 in FIG. 14) for driving the pusher may be attached there.

The permanent magnet 4 which shaped the same quadratic prism as the magnet housing groove 1e is attached in the groove 1e with a fixing method such as joint or pressure insertion. As this permanent magnet 4, such magnets that show high holding power and are hardly demagnetized, for example, rare-earth magnets such as samarium-cobalt magnets and neodymium magnets, and ferrite series magnets, are used.

The stopper 5 comprises a disk having a screw insertion hole at eccentric position, and is attached to the rear surface of the pusher plate 3 by screwing down a fixing screw FC into the screw holes 3c through the screw insertion holes. This stopper 5 is positioned in the guide hole 1c1 in a state where the pusher plate 3 is housed in the groove 1c for the pusher moving cavity, and defines the moving limit of the pusher plate 3 upward and downward.

When the component supply apparatus SY1 shown as the first embodiment is assembled, the pusher plate 3 is housed in the groove 1c for the pusher moving cavity, and then the cover plate 2 is piled on the front of the chute plate 1. And the cover plate 2 is fixed to the chute plate 1 by screwing down the fixing screw FC into the screw holes 1h of the chute plate 1 through the screw insertion holes of the cover plate 2.

The component passage 1a in the component supply apparatus SY1 comprises such a shape that the taper portion 1a11, the first straight portion 1a1, the first curved portion 1a2, the second straight portion 1a3, the second curved portion 1a4, the third straight portion 1a5, the third curved portion 1a6, the fourth straight portion 1a7, the fifth straight portion 1a8, and the sixth straight portion 1a9 are placed in succession in order, and cross-section of each portion respectively has a square shape or a similar shape. Incidentally, in the component passage 1a, the dimension in the front-to-rear direction (refer to the symbol W1a in FIG. 7) is referred to as width dimension, and the dimension in the direction which intersects that front-to-rear direction in an orthogonal manner (refer to the symbol T1a7 and T1a9 in FIG. 5) is referred to as thickness dimension.

Figure 6:
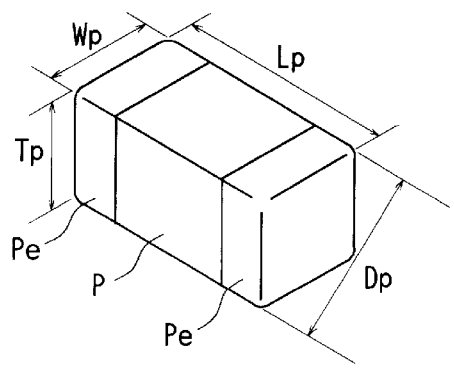
FIG. 6 is a perspective view showing an example of chip component applicable to the component supply apparatus shown in FIG. 1(A)

In this component passage 1a, a quadratic prism chip component P as shown in FIG. 6, for example, can be housed under the state of being arranged in order in the longitudinal direction. This chip component P is chip capacitor and chip resistor, etc., and includes external electrodes Pe at the both end portions in the longitudinal direction. This chip component P has a predetermined length dimension Lp, a width dimension Wp, and a height dimension Tp, wherein the width dimension Wp and the height dimension Tp are approximately coincided and the both dimensions are smaller than the length dimension Lp. Incidentally, the symbol Dp is a diagonal dimension of the end surface of the chip component P.

In the component passage 1a, the first straight portion 1a1, the first curved portion 1a2, the second straight portion 1a3, the second curved portion 1a4, the third straight portion 1a5, the third curved portion 1a6, the fourth straight portion 1a7, the fifth straight portion 1a8, the sixth straight portion 1a9, and the taper portion 1a11 have the exactly same width dimension, which width dimension is slightly larger than the width dimension Wp as well as the height dimension Tp of the chip component P, and is slightly smaller than the diagonal dimension Dp of the end surface of the chip component P.

Figure 5:
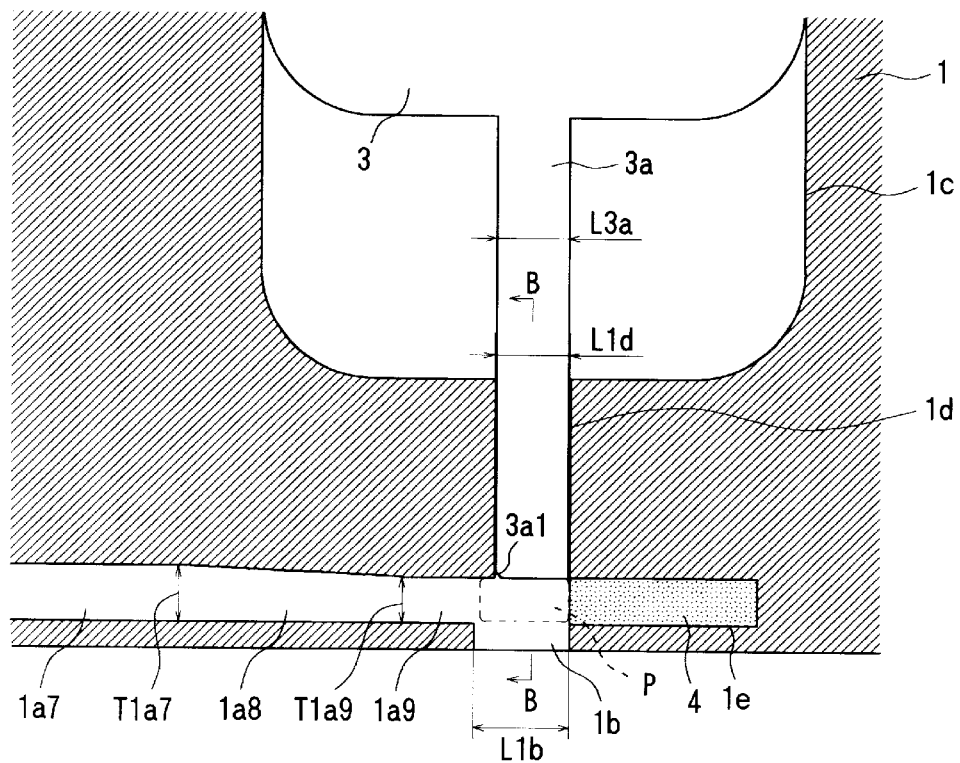
FIG. 5 is an enlarged sectional view of a component discharge portion of the component supply apparatus shown in FIG. 1(A)

In addition, the first straight portion 1a1, the second straight portion 1a3, the third straight portion 1a5, and the fourth straight portion 1a7 have the exactly same thickness dimension, which thickness dimension is slightly larger than the width dimension Wp as well as the height dimension Tp of the chip component P, and is slightly smaller than the diagonal dimension Dp of the end surface of the chip component P. As shown in FIG. 5, the thickness dimension T1a9 of the sixth straight portion 1a9 is smaller than the thickness dimension T1a7 of the fourth straight portion 1a7, but is slightly larger than the width dimension Wp as well as the height dimension Tp of the chip component P. Moreover, the fifth straight portion 1a8 has its upper surface inclining right-downward, and its thickness dimension gradually changes from T1a7 to T1a9. The first curved portion 1a2, the second curved portion 1a4, and the third curved portion 1a6 basically have the same thickness dimension as the thickness dimensions of the straight portions, but when the opposing two curved surfaces have small radius of curvature, the thickness dimension at the center of the curved portions is set slightly more largely. Moreover, the thickness dimension of the taper portion 1a11 which is provided in the upper side of the first straight portion 1a1, gradually changes from the value slightly larger than the thickness dimension of the first straight portion 1a1 to the thickness dimension of the first straight portion 1a1. The maximum value of the thickness dimension of this taper portion 1a11 is slightly larger than the diagonal dimension Dp of the end surface of the chip component P.

The component discharge opening 1b is formed at the lower surface of the tip of the sixth straight portion 1a9 as shown in FIG. 5, and the length dimension L1b of this component discharge opening 1b is slightly larger than the length dimension Lp of the chip component P. In addition, as shown in FIG. 7, the width dimension W1b of the component discharge opening 1b is the same as the width dimension W1a9 of the sixth straight portion 1a9, and the surface of the component discharge opening 1b located at the same side of the end surface of the tip of the sixth straight portion 1a9 is on the same plane as the end surface of the tip of the sixth straight portion 1a9.

The pusher insertion opening id is formed at the upper surface of the tip of the sixth straight portion 1a9 as shown in FIG. 5, and the length dimension L1d of this pusher insertion opening 1d is slightly smaller than the length dimension Lp of the chip component P. In addition, as shown in FIG. 7, the width dimension W1c of the pusher moving cavity 1c as well as the width dimension W1d of the pusher insertion opening 1d are the same as the width dimension W1a9 of the sixth straight portion 1a9, and as shown in FIG. 5, the surface of the pusher insertion opening 1d located at the same side of the end surface of the tip of the sixth straight portion 1a9 is on the same plane as the end surface of the tip of the sixth straight portion 1a9.

Figure 7:
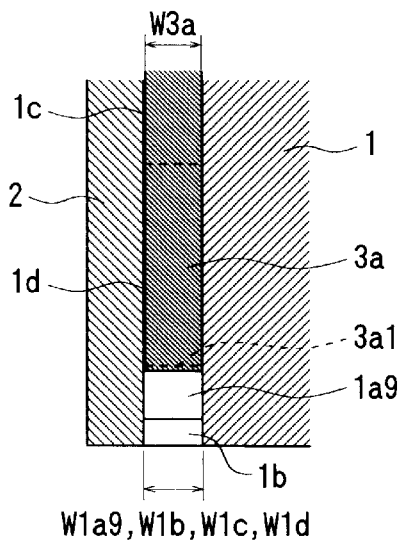
FIG. 7 is a sectional view along a line B—B in FIG. 5.

As shown in FIG. 5, the length dimension L3a of the tip portion 3a of the pusher 3 is slightly smaller than the length dimension L1d of the pusher insertion opening 1d, and as shown in FIG. 7, the width dimension W3a of the tip portion 3a of the pusher 3 is slightly smaller than the width dimension W1d of the pusher insertion opening 1d. In addition, at the left end edge of the tip portion 3a of the pusher 3, chamfering 3a1 or rounding is implemented so as to prevent thread engagement of the chip component P.

As shown in FIG. 5, a permanent magnet 4 shaped quadratic prism has approximately the same cross-section shape as the sixth straight portion 1a9 of the component passage 1a, and has its upper surface placed in the same height as the upper surface of the sixth straight portion 1a9, and has its lower surface placed in the same height as the lower surface of the sixth straight portion 1a9.i This permanent magnet 4 has N-pole and S-pole at the both side in the longitudinal direction, and either pole surface of N-pole or S-pole is on the same plane as the end surface of the tip of the sixth straight portion 1a9. In other words, one pole surface of the permanent magnet 4 configures the end surface of the tip of the component passage 1a. Incidentally, the aforementioned permanent magnet 4 may have a cross-section shape smaller than the cross-section shape of the sixth straight portion 1a9 and one pole surface may configure a portion of the end surface of the tip of the component passage 1a.

Incidentally, the chip component P is manufactured so as to have the length dimension Lp, the width dimension Wp, and the height dimension Tp shown in FIG. 6 respectively as set dimensions. However, the respective actual dimensions naturally include their own tolerance (dimension error within a range to be regarded as a good product), even if the chip component P is supposed to fall in a same kind, individual component size delicately change within a range of tolerance. That is, for the chip component P to be housed in the component passage 1a, there exists the maximum size which is attainable by adding the plus values of tolerance to the respective set dimensions, namely the length dimension Lp, the width dimension Wp, and the height dimension Tp, and there exists the minimum size which is attainable by subtracting the minus values of tolerance from the respective set dimensions.

For the aforementioned component supply apparatus SY1, taking the set dimensions as well as tolerance of the chip component P as an object to be supplied into consideration, sizes of the component passage 1a, the component discharge opening 1b, and the pusher insertion opening 1d are respectively set up. Size setting in a case where the chip component P to be handled has, for example, the set dimensions of the length dimension Lp, the width dimension Wp, and the height dimension Tp respectively being 1.6 mm, 0.8 mm. 0.8 mm with respective tolerance of ±0.07 mm is described as follows.

In this case, the width dimension of the first straight portion 1a1, the first curved portion 1a2, the second straight portion 1a3, the second curved portion 1a4, the third straight portion 1a5, the third curved portion 1a6, the fourth straight portion 1a7, the fifth straight portion 1a8, the sixth straight portion 1a9, and the taper portion 1a11 in the component passage 1a is set to 1.1 mm slightly larger than 0.87 mm being the maximum value of the width dimension Wp, and the height dimension Tp of the chip component P.

In addition, the thickness dimension of the first straight portion 1a1, the first curved portion 1a2, the second straight portion 1a3, the second curved portion 1a4, the third straight portion 1a5, the third curved portion 1a6, and the fourth straight portion 1a7 is set to 1.1 mm slightly larger than 0.87 mm being the maximum value of the width dimension Wp and the height dimension Tp of the chip component P. In addition, the thickness dimension of the sixth straight portion 1a9 is set to 0.88 mm slightly larger than 0.87 mm being the maximum value of the width dimension Wp and the height dimension Tp of the chip component P. That is, the thickness dimension of the fifth straight portion 1a8 gradually changes from 1.1 mm to 0.88 mm. Moreover, the maximum value of the thickness dimension of the taper portion 1a11 is set to 1.36 mm slightly larger than 1.23 mm being the maximum value of the diagonal dimension Dp of the end surface of the chip component P. That is, the thickness dimension of the taper portion 1a11 gradually changes from 1.36 mm to 1.1 mm.

In addition, the length dimension L1b of the component discharge opening 1b is set to 1.75 mm slightly larger than 1.67 mm being the maximum value of the length dimension Lp of the chip component P. In addition, the width dimension W1b of the component discharge opening 1b is set to 1.1 mm slightly larger than 0.87 mm being the maximum value of the width dimension Wp and the height dimension Tp of the chip component P.

In addition, the length L1d of pusher insertion opening 1d is set to 1.4 mm slightly smaller than 1.53 mm being the minimum value of the length dimension Lp of the chip component P. In addition, the width dimension W1d of the pusher insertion opening 1d is set to 1.1 mm slightly larger than 0.87 mm being the maximum value of the width dimension Wp and the height dimension Tp of the chip component P.

When the chip component having the setup dimension as well as tolerance other than the aforementioned is being handled, the same size setting as the aforementioned may be implemented.

Figure 8:
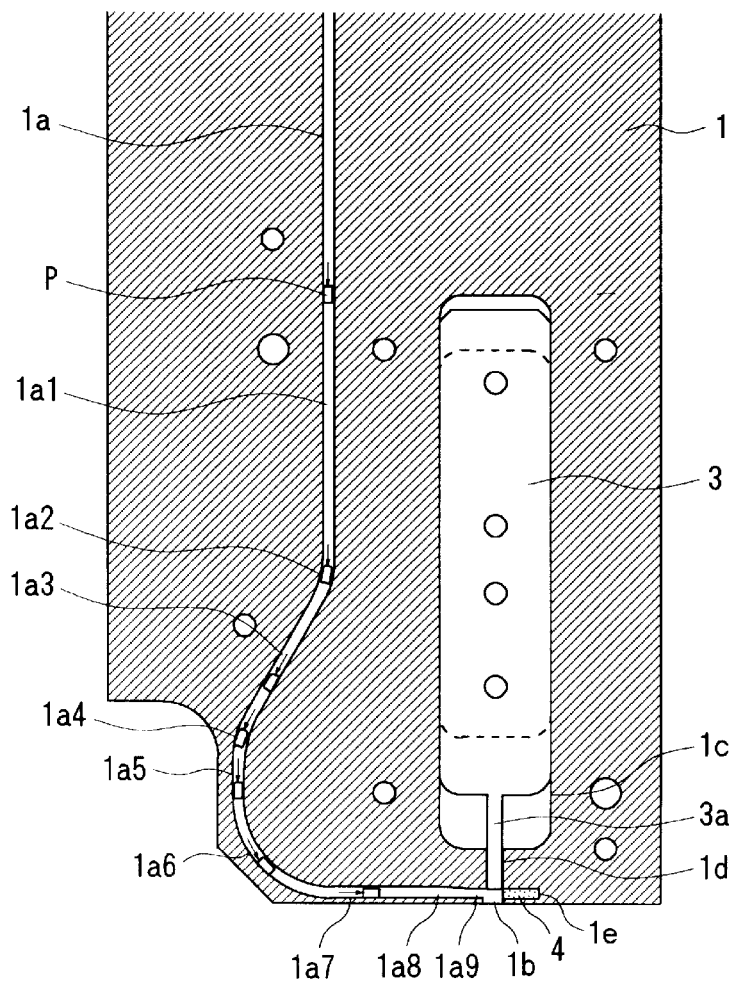
FIG. 8 is an operation-explaining view related to a component movement of the component supply apparatus shown in FIG. 1(A)

The operation of the component supply apparatus SY1 shown as the first embodiment will be described as follows with reference to FIGS. 8 to 11. In this connection, as shown in FIG. 8, the tip portion 3a of the pusher plate 3 is in its waiting position when its lower surface is positioned in the same height as the upper surface of the tip of the component passage 1a.

The component housing in the component passage 1a is implemented by throwing the chip component P into the upper end opening of the component passage 1a in the longitudinal direction. As shown in FIG. 8, the chip component P thrown into the component passage 1a moves downward so as to pass the taper portion 1a11, the first straight portion 1a1, the first curved portion 1a2, the second straight portion 1a3, the second curved portion 1a4, the third straight portion 1a5, and the third curved portion 1a6 in order.

Figure 9A:
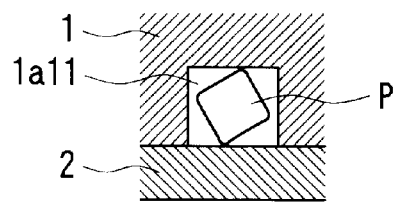
FIG. 9(A) and FIG. 9(B) are operation-explaining views related to the component movement of the component supply apparatus shown in FIG. 1(A)

Since the thickness dimension of the taper portion 1a11 is set up slighter larger than the maximum value of diagonal dimension Dp of the chip component P, the chip component P after throwing into the passage will in the posture shown in FIG. 9(A), that is, enter in such a posture that the four side surfaces of the chip component P and the four inner surfaces of the taper portion 1a11 do not remain in parallel. However, since the thickness dimension of the taper 1a11 gradually changes smaller toward downward, this chip component P comes into contact in particular with the two inclined inner surfaces in the thickness direction, thus its posture is corrected, and thus attains the suitable posture shown in FIG. 9(B), that is, the posture with four side surfaces of the chip component P correctly facing the four inner surfaces of the first straight portion 1a1 respectively when the chip component P enters the first straight portion 1a1.

Figure 9B:
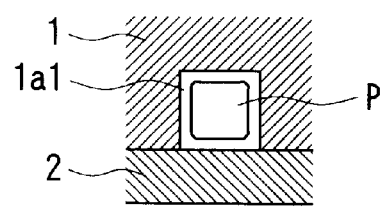

In addition, even if the posture of the chip component P goes out of order as shown in FIG. 9(A) when the chip component P from the taper portion 1a11 passes the first straight portion 1a1, this chip component P comes into contact in particular with the two inner surfaces of the first curved portion 1a2 in the thickness direction when the chip component P passes the first curved portion 1a2, thus its posture is corrected, and attains the suitable posture shown in FIG. 9(B).

Moreover, even if the posture of the chip component P goes out of order as shown in FIG. 9(A) when the chip component P from the first curved portion 1a2 passes the second straight portion 1a3, this chip component P comes into contact with the two inner surfaces of the second curved portion 1a4 in the thickness direction, in particular, when the chip component P passes the second curved portion 1a4, thus its posture is corrected, and attains the suitable posture shown in FIG. 9(B).

Furthermore, even if the posture of the chip component P goes out of order as shown in FIG. 9(A) when the chip component P from the second curved portion 1a4 passes the third straight portion 1a5, this chip component P comes into contact with the two inner surfaces of the third curved portion 1a6 in the thickness direction, in particular, when the chip component P passes the third curved portion 1a6, thus its posture is corrected, and attains the suitable posture shown in FIG. 9(B).

The chip component P which passes the taper portion 1a11, the first straight portion 1a1, the first curved portion 1a2, the second straight portion 1a3, the second curved portion 1a4, the third straight portion 1a5, and the third curved portion 1a6 in order travels toward downward extremely smoothly subject to application of the foregoing posture correction. In addition, during the procedure when the chip component P passes the third curved portion 1a6, the direction of the chip component P is changed from vertical to lateral.

Being pushed from behind by the following chip components P, the chip component P after its direction is changed laterally travels in right direction so as to pass the fourth straight portion 1a7, the fifth straight portion 1a8, and the sixth straight portion 1a9 in order.

Since the thickness dimension of the fifth straight portion 1a8 gradually changes smaller toward rightward, even if the posture of the chip component P goes out of order as shown in FIG. 9(A) when the chip component P from the third curved portion 1a6 passes the fourth straight portion 1a7, this chip component P comes into contact with the inclined upper surface of the fifth straight portion 1a8 in the thickness direction when the chip component P passes the fifth straight portion 1a8, thus its posture is corrected, and attains the suitable posture shown in FIG. 9(B).

Figure 10:
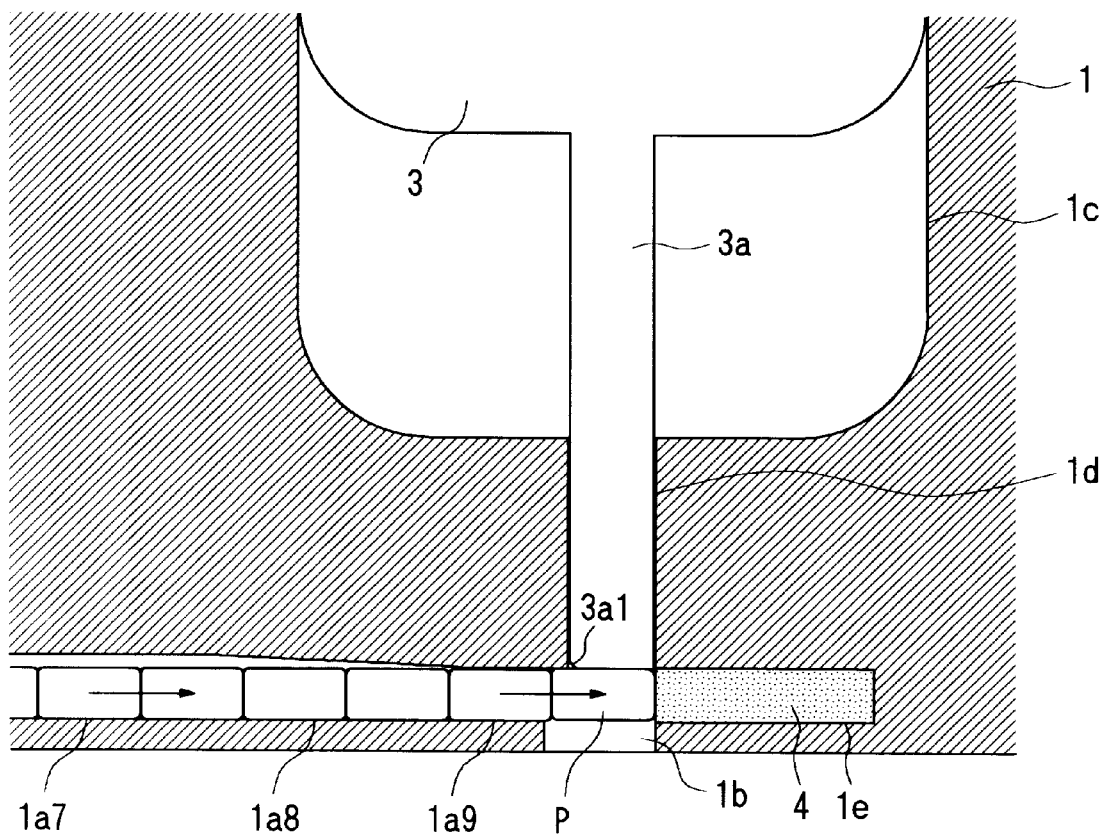
FIG. 10 is an operation-explaining view related to a component discharge of the component supply apparatus shown in FIG. 1(A)

The chip component P from the fifth straight portion 1a8 passes the sixth straight portion 1a9, and as shown in FIG. 10, the forefront chip component P comes near the permanent magnet 4, and there it is attracted by magnet force of the permanent magnet 4 with the end surface of the chip component P coming into contact with the exposed surface of the permanent magnet 4 so as to keep a suction-held state. The following chip components P make a line after this forefront chip component P without any space. Since, at the left end edge of the tip portion 3a of the pusher 3, chamfering 3a1 or rounding is implemented so as to prevent thread engagement of the chip component P, even if the tip portion 3a might protrude downward slightly, the chip component P attracted to the permanent magnet 4 do not engage with the tip portion 3a. In addition, the component holding power of the permanent magnet 4 exceeds the weight of one chip component, thus the forefront chip component P is attached to the permanent magnet 4 by attraction maintains the state shown in FIG. 10 without dropping out due to its own weight.

Figure 11:
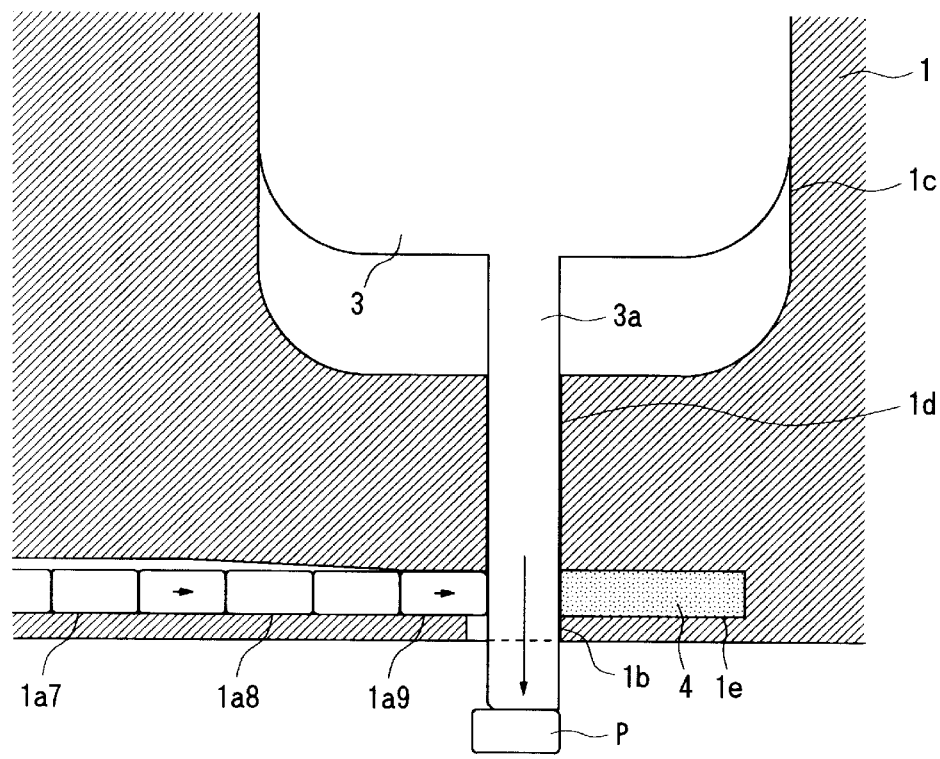
FIG. 11 is an operation-explaining view related to the component discharge of the component supply apparatus shown in FIG. 1(A)

As concerns the state in FIG. 10, when the pusher plate 3 is caused to move down, as shown in FIG. 11, the forefront chip component P attraction-held by the permanent magnet 4 is pushed to move downward with the tip portion 3a, and this chip component P is discharged outward from the component discharge opening 1d with its lateral posture still being maintained. With the downward velocity of the pusher plate 3 being set at not less than the drop velocity due to self-weight of the chip component P, the chip component P can be continued to contact the lower surface of the tip portion 3a while being discharged outward. The surface of the component discharge opening 1b located at the same side of the end surface of the tip of the component passage 1a and the surface of the pusher insertion opening 1d are on the same plane as the end surface of the tip of the component passage 1a, not only the movement of the tip portion 3a of the pusher plate 3 in accordance with component discharge and the movement of the chip component P can be implemented smoothly, but also the posture of the chip component P can be protected from going out of order during the component discharge procedure.

When the pusher plate 3 is caused to move up and to be returned after having discharged the component, as shown in FIG. 10, all following chip components move through the component passage 1a due to its own weight while receiving the same posture correcting action as described above. The next forefront chip component P comes near the permanent magnet 4, and there it is attracted by magnet force of the permanent magnet 4 with the end surface of the chip component P coming into contact with the exposed surface of the permanent magnet 4 so as to keep a suction-held state. The following chip components P make a line after this forefront chip components P without any space.

That is, repeating downward and upward travel of the pusher plate 3 can discharge the forefront chip component P in the component passage 1a sequentially from the component discharge opening 1b with its lateral posture still being maintained.

Figure 12:
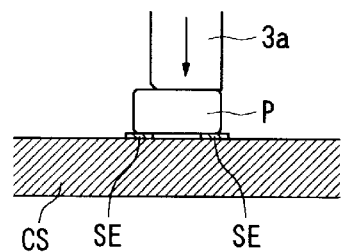
FIG. 12 is an explanatory view showing a case where a discharged component is being mounted on a circuit substrate.

Therefore, as shown in FIG. 12, with the circuit substrate CS being disposed near the component discharge opening 1b, the aforementioned discharged component P can be mounted on the substrate electrode SE such as a land, etc., and there is no need to transfer and mount the chip component with a suction nozzle as done in conventional cases, thus the component mounting time per component can be shortened to a large extent. With the upper surface of the substrate electrode SE having been coated with paste-state joint material such as a cream solder, etc., in advance, taking advantage of viscosity of the joint material, the chip component P can be tentatively fixed, and also the discharged component P can be pressure attached into the circuit substrate CS. In addition, component mounting on the circuit substrate CS can be implemented in a high speed cycle by proceeding with aforementioned component discharge while the relative position between the circuit substrate CS and the component supply apparatus SY1 is being changed.

Figure 13A:
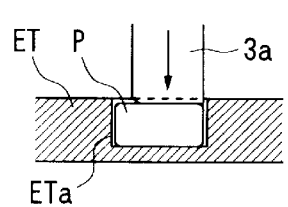
FIG. 13(A) is an explanatory view showing a case where a discharged component is being inserted into the housing recess of a component wrapping tape.
Figure 13B:
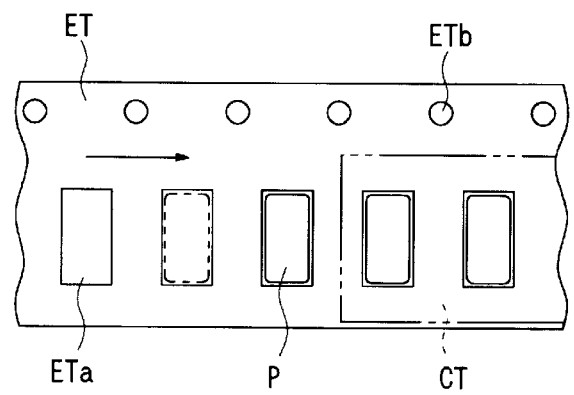
FIG. 13(B) is a top view of the component wrapping tape shown in FIG. 13(A)

In addition, as shown in FIG. 13(A), with the component wrapping tape ET being disposed near the component discharge opening 1b, the aforementioned discharged component P can be inserted into the housing recess ETa of the component wrapping tape ET, and there is no need to transfer and inset the chip component with a suction nozzle as done in conventional cases, thus the component insertion time per component can be shortened to a large extent. In addition, component insertion into a housing recess ETa can be implemented in a high speed cycle by proceeding with aforementioned component discharge while the relative position between the component wrapping tape ET and the component supply apparatus SY1 is being changed. In this connection, the component wrapping tape ET as shown in FIG. 13(A) has a number of housing recesses ETa with an even distance in between in the longitudinal direction as shown in FIG. 13(B), and the housing recess ETa after insertion of a component is covered by the cover tape CT to be joined on the surface of the component wrapping tape ET. The component wrapping tape ET includes the guide holes ETa engaging pins of sprockets for tape traveling (not shown due to omission) with an even distance in between in a longitudinal direction, and intermittently travels in a direction of the arrow symbol with distance correspondent with the distance indicated in the housing recess ETa at a time.

According to the component supply apparatus SY1 having been shown as the first embodiment, reciprocating the pusher plate 3 in the downward and upward direction can discharge the forefront chip component P in the component passage 1a sequentially from the component discharge opening 1b with its lateral posture still being maintained. Therefore, disposing a circuit substrate CS near the component discharge opening 1b can implement component mounting on the circuit substrate CS in a high speed cycle by proceeding with aforementioned component discharge while the relative position between the circuit substrate CS and the component discharge apparatus SY1 is being changed and, in particular, component mounting in an extremely high speed of not more than 0.1 sec can sufficiently be implemented. In addition, disposing a component wrapping tape ET near the component discharge opening 1b can sufficiently implement component insertion into a housing recess ETa in a high speed cycle by proceeding with aforementioned component discharge while the relative position between the component wrapping tape ET and the component supply apparatus SY1 is being changed and, in particular, component insertion in an extremely high speed of not more than 0.1 sec can sufficiently be implemented.

In addition, the component passage 1a is provided with three curved portions 1a2, 1a4, and 1a6 halfway the passage, the two among which are arranged different in the curved direction each other, and these chip components P traveling downward by their own weights in the component passage 1a can be caused to contact the inner surfaces of the respective curved portions, in particular, two inner surfaces in the thickness direction so that their positions are corrected accurately, and this enables the components to move in the component passage 1a extremely smoothly. Therefore, even when the aforementioned component discharge cycle is sped up, the movement of components in the component passage 1a is ensured to follow this component discharge cycle so that the desired component discharge may be conducted well without giving rise to any fault.

Moreover, a region where the thickness dimension of the component passage 1a gradually get smaller is provided in the straight portion in the lateral direction provided in the foremost portion of the passage, namely the fifth straight portion 1a8, therefore, the chip component P to be transferred into the component discharge opening 1d do not incur any disorder in posture, but as a result of this, the aforementioned component discharge can be implemented with a stable posture. Incidentally, the aforementioned region may be arranged so that the width dimension in addition to the thickness dimension of the passage may gradually get smaller to attain a similar result and effect.

Furthermore, the surface of component discharge opening 1b located at the same side of the end surface of the tip of the component passage 1a and the surface of the pusher insertion opening 1d are on the same plane as the end surface of the tip of the component passage 1a, and thus, even when the component discharge cycle is sped up, not only the movement of the tip portion 3a of the pusher plate 3 in accordance with component discharge and the movement of the chip component P can be implemented smoothly, but also the posture of the chip component P can be protected from going out of order during the component discharge procedure.

Furthermore, the width dimension W1a of the component passage 1a is correspond with the width dimension W1b of the component discharge opening 1b as well as the width dimension W1d of the pusher insertion opening 1d so that any unnecessary step between the component discharge opening 1b and the component passage 1a, or between the pusher insertion opening 1d and the component passage 1a can be avoided and such problems as component clogging as well as chamfering, etc. due to the step can be prevented in advance.

Furthermore, the length dimension L1d of the component discharge opening 1d is set slightly larger than the maximum value including the tolerance of the length dimension Lp of the chip component P, and the length dimension L1d of the pusher insertion opening 1d is set slightly smaller than the minimum value including the tolerance of the length dimension Lp of the chip component P, and therefore, even if the size of the chip components P becoming the object to be supplied delicately changes within the range of the tolerance, the component discharge operation by the pusher plate 3 can always be proceeded under a stable state.

Incidentally, the component supply apparatus SY1 having shown as the first embodiment can handle electronic components other than chip components having shown in FIG. 6, e.g., composite components such as LC filters and networks, etc., or integrated circuit components such as semiconductor elements, etc., and also can handle columnar electronic components.

In addition, the component supply apparatus SY1 having shown as the first embodiment can proceed with component discharge under a state where the component supply apparatus SY1 is a little bit inclined, and can be sufficiently adjustable to component mounting on an inclined circuit substrate, and component insertion into an inclined housing recess of component wrapping tape.

Figure 14:
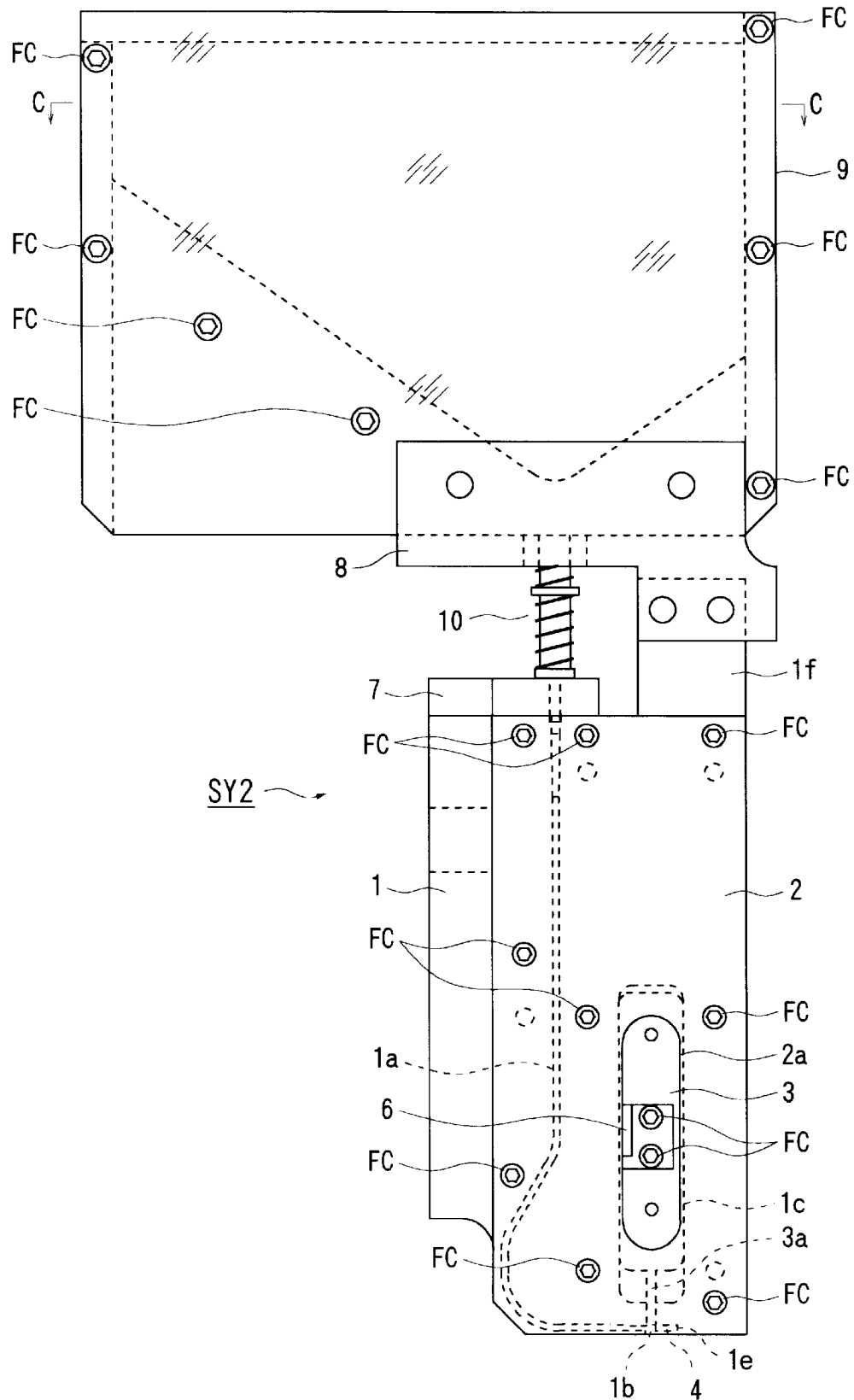
FIG. 14 is a front view of the component supply apparatus related to a second embodiment of the present invention.
Figure 15:
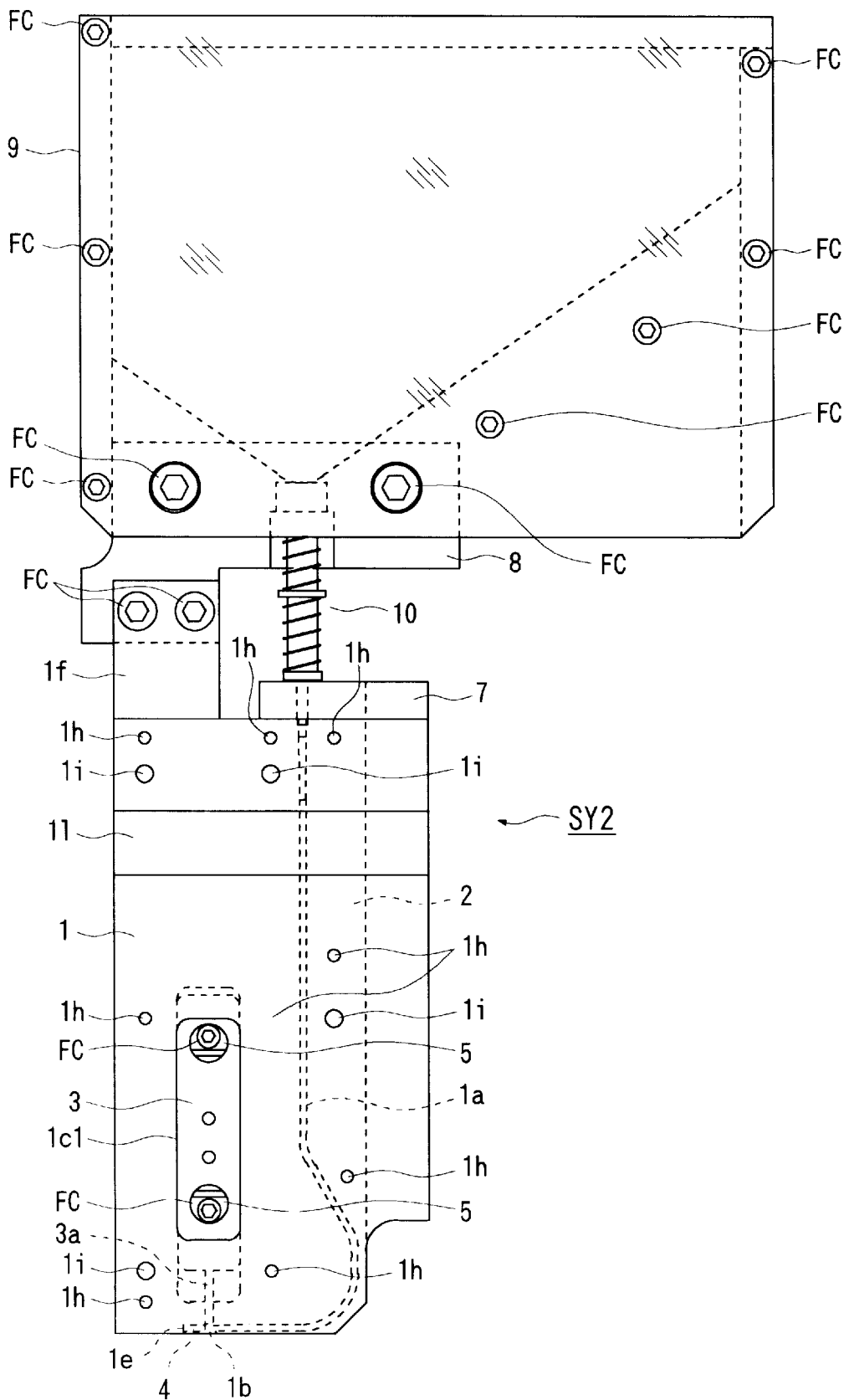
FIG. 15 is a rear view of the component supply apparatus shown in FIG. 14.

FIGS. 14 to 23 show a second embodiment of the present invention. Incidentally, in the following description, for the convenience of the description, the front side in FIG. 14 is expressed as "front," the rear side as "behind," the left side as "left," and the right side as "right."

The component supply apparatus SY2 shown as the second embodiment comprises a bracket 6 for pusher driving, a pipe holder 7, a block 8 for mounting a component storage case, the component storage case 9, and a pipe mechanism 10 which are added to the component supply apparatus SY1 shown as the first embodiment. Since configuration of the component supply apparatus SY1 is as described before, description on it is omitted here.

Figure 16:
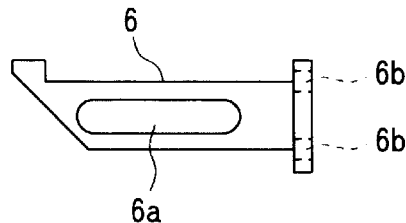
FIG. 16 is a right-side view of a bracket shown in FIG. 14.

As shown in FIG. 16, the bracket 6 for pusher driving comprises a plate member shaped like a letter L seen from the upper surface, and has an oblong hole 6a in one bent piece for plunger engagement, and two screw insertion holes 6b in the other bent piece. This bracket 6 is attached to the front surface of the pusher plate 3 by screwing down the fixing screw FC into the screw holes 3d of the pusher plate 3 through the screw insertion holes 6b.

Figure 17:
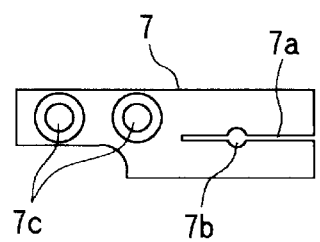
FIG. 17 is a top view of a pipe holder shown in FIG. 14.

As shown in FIG. 17, the pipe holder 7 has a slit 7a formed toward the center from one side in longitudinal direction, a circle pipe holding portion 7b provided halfway in the slit 7a, and two screw insertion hole 7c are through-formed from upper surface to lower surface at the other side in a longitudinal direction. This pipe holder 7 is attached onto the upper surface of the chute plate 1 by screwing down the fixing screw FC into the screw holes 1$k$ through the screw insertion holes 7$c$. The screw insertion holes 7$c$ comprise a large diameter portion and small diameter portion consecutively, and the head portion of the fixing screw FC enters the large diameter portion.

Figure 18A:
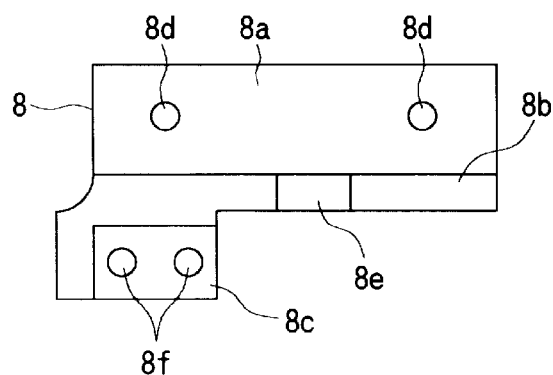
FIG. 18(A) is a rear view of a block shown in FIG. 14.
Figure 18B:
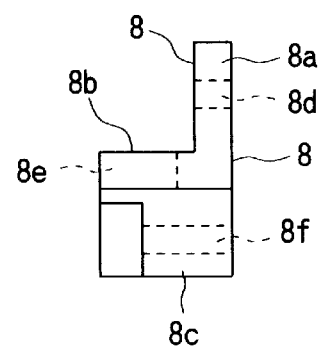
FIG. 18(B) is a left-side view of the block shown in FIG. 14.

As shown in FIG. 18, the block 8 for attaching the component storage case has the upper vertical piece 8$a$, the horizontal piece 8$b$, and the lower vertical piece 8$c$ to be consecutively arranged in order. Two screw holes 8$d$ are through-formed in the upper vertical piece 8$a$, cut-off portion 8$e$ shaped like square groove is formed in the horizontal piece 8$b$, and two screw holes 8$f$ are through-formed in the lower vertical piece 8$c$. The stretched portion 1$f$ of the aforementioned chute plate 1 is attached to the rear surface of the lower vertical piece 8$c$ of the block 8 by screwing down the fixing screw FC into the screw holes 8$f$ of the block 8 through the screw insertion holes 1$j$. In addition, the component storage case 9 to be mentioned later is attached to the rear surface of the upper vertical piece 8$a$ of the block 8 by screwing down the fixing screw FC into the screw holes 8$d$ of the block 8 through the screw insertion holes in the second case side plate 9$e$ and case bottom plate 9$a$ and the first case side plate 9$d$.

Figure 19:
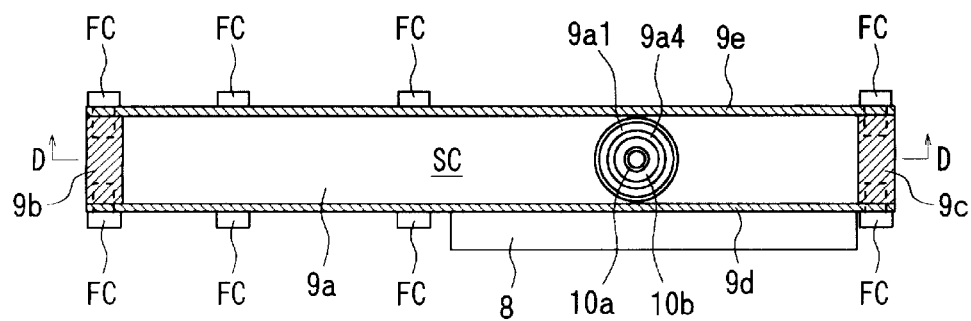
FIG. 19 is a sectional view along a line C—C in FIG. 14.
Figure 20:
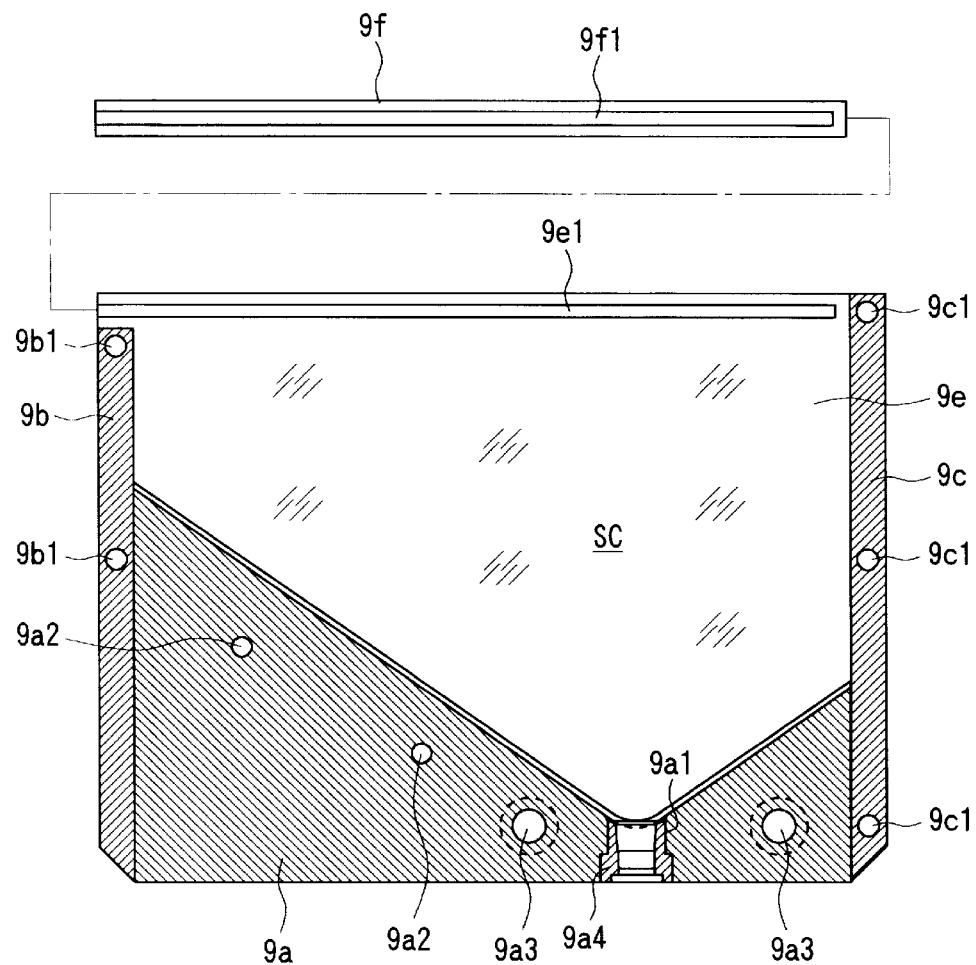
FIG. 20 is a sectional view along a line D—D in FIG. 19.

As shown in FIGS. 19 and 20, the component storage case 9 comprises a case bottom plate 9$a$ having V-shaped inclined surface on the upper surface, a band-shaped first case frame 9$b$, a band-shaped second case frame 9$c$, a rectangular first case side plate 9$d$, a rectangular second case side plate 9$e$, and a case cover 9$f$.

In the case bottom plate 9$a$, a circle hole 9$a$1 has been through-formed in the upward-to-downward direction at the deepest portion of the V-shaped inclined surface. In addition, in the case bottom plate 9$a$, two screw holes 9$a$2 and two screw insertion holes 9$a$3 are through-formed. The screw insertion holes 9$a$3 comprises a large diameter portions and small diameter portions consecutively, and the head portion of the fixing screws FC enter the large diameter portions. Moreover, the approximately cylindrical bush 9$a$4 is attached to the circle hole 9$a$1 with fixing technique such as joint or pressure insertion, etc.

Two screw holes 9$b$1 are through-formed in the first case frame 9$b$, and three screw holes 9$b$1 are through-formed in the second case frame 9$c$. The thickness of the first case frame 9$b$ and the second case frame 9$c$ are correspondent with the thickness of the case bottom plate 9$a$.

Seven screw insertion holes (without symbols) in correspondent with the screw holes 9$a$1, 9$b$1 and 9$c$1 are through-formed in the first case side plate 9$d$ and the second case side plate 9$e$ respectively. In addition, the slide grooves 9$d$1 and 9$e$1 (the symbol 9$d$1 is not shown due to omission) for the case cover are formed on the upper inner surfaces of the first case side plate 9$d$ and the second case side plate 9$e$ respectively.

The slide protrusion 9$f$1 to engage movably the aforementioned slide grooves is formed on the both side surfaces of the case cover 9$f$ in the width direction.

The aforementioned component storage case 9 is assembled so that, under the state that the case bottom plate 9$a$, the first case frame 9$b$, and the second case frame 9$c$ are combined as in FIG. 18, the first case side plate 9$d$ is laminated onto the front surface of the case bottom plate 9$a$, and then the fixing screws FC are screwed down into the screw holes 9$a$1, 9$b$1 and 9$c$1 through the screw insertion holes and at the same time the second case side plate 9$e$ is laminated onto the rear surface of the case bottom plate 9$a$, and then the fixing screws FC are screwed down into the screw holes 9$a$1, 9$b$1 and 9$c$1 through the screw insertion holes, and thereafter the slide protrusion 9$f$1 of the case cover 9$f$ is fit in to the slide groove. Inside the component storage case 9 after assembly, the flat component storage chamber SC in correspondent with the thickness of the case bottom plate 9$a$ is formed.

Figure 21:
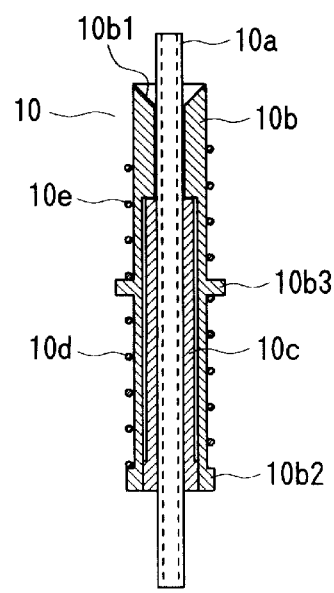
FIG. 21 is a longitudinal section of a pipe mechanism shown in FIG. 14.

As shown in FIG. 21, the pipe mechanism 10 is configured by comprising a component replenish pipe 10$a$, a movable pipe 10$b$ disposed movably upward and downward outside the component replenish pipe 10$a$, a bush 10$c$ provided inside the movable pipe 10$b$ for the component replenish pipe, a first coil spring 10$d$, and a second coil spring 10$e$.

The inner diameter of the component replenish pipe 10$a$ is slightly larger than the maximum end surface length of the chip component P to be an object to be supplied so as to be capable of taking in the chip component P one by one in the longitudinal direction. The section thickness of this component replenish pipe 10$a$ is smaller than the end surface maximum length of the chip component P. Of course, the cross-sectional shape of the inner hole of this component replenish pipe 10$a$ may be rectangular so as to align the shape of the end surface of the chip component P.

Figure 22:
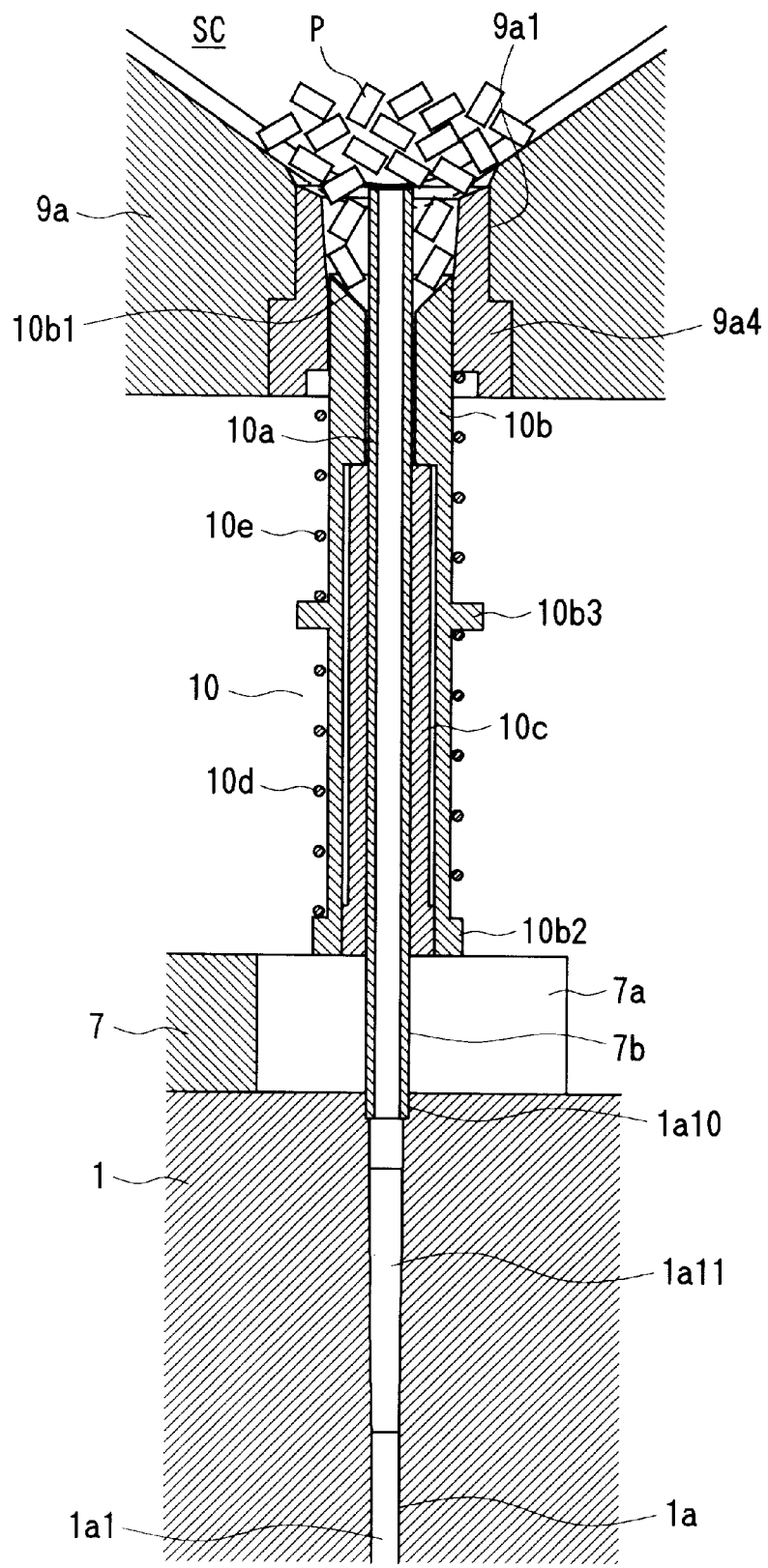
FIG. 22 is an operation-explaining view related to a component replenishment of the component supply apparatus shown in FIG. 14.

The inner diameter of the movable pipe 10$b$ is slightly larger than the outer diameter of the component replenish pipe 10$a$, and the outer diameter of the movable pipe 10$b$ is slightly larger than the inner diameter of the aforementioned bush 9$a$4. The section thickness of this movable pipe 10$b$ is slightly larger than the end surface maximum length of the chip component P. A mortar-shaped guide surface 10$b$1 is formed at the upper end of the movable pipe 10$b$, a first collar 10$b$2 is formed on the lower end periphery surface, and a second collar 10$b$3 is formed on the central periphery surface. The aforementioned first coil spring 10$d$ is provided between the first collar 10$b$2 and the second collar 10$b$3, and the aforementioned second coil spring 10$e$ is provided on the second collar 10$b$3. This pipe mechanism 10 is disposed between the aforementioned chute plate 1 and the component storage case 9. In detail, as shown in FIG. 22, the lower portion of the component replenish pipe 10$a$ is inserted into the pipe attachment mouth 1$a$10 of the chute plate 1 through the pipe holding portion 7$b$ of the pipe holder 7, and the upper portion of the movable pipe 10$b$ is inserted inside the bush 9$a$4 of the component storage case 9. In addition, the upper end of the second coil spring 10$e$ contacts the bush 9$a$4, and the lower end of the movable pipe 10$b$ contacts the upper surface of the pipe holder 7 by application of influence of the second coil spring 10$e$.

The operation of the component supply apparatus SY2 shown as the second embodiment will be described as follows with reference to FIGS. 22 and 23. Since the component moving operation and the component discharge operation in this component supply apparatus SY2 is the same as that of the component supply apparatus SY1 which has been described before, description on it is omitted here.

Component supply inside the component storage room SC is implemented by opening the case cover 9$f$ and then throwing the chip components P into inside the component storage room SC. FIG. 22 shows a small number of chip components P, but in reality, several thousand or several tens of thousand of chip components P are stored inside the component storage case SC.

Under the waiting state shown in FIG. 22, the upper end of the component replenish pipe 10$a$ is located at the same level of or slightly lower than the deepest portion of the component storage case SC. In addition, the upper end of the movable pipe 10b is located lower than the upper end of the component replenish pipe 10a, and the annular space is formed in the upper side of the movable pipe 10b. As shown in the drawing, under the waiting state, a small number of chip components P is entered the annular space formed in the upper side of the movable pipe 10b.

Figure 23:
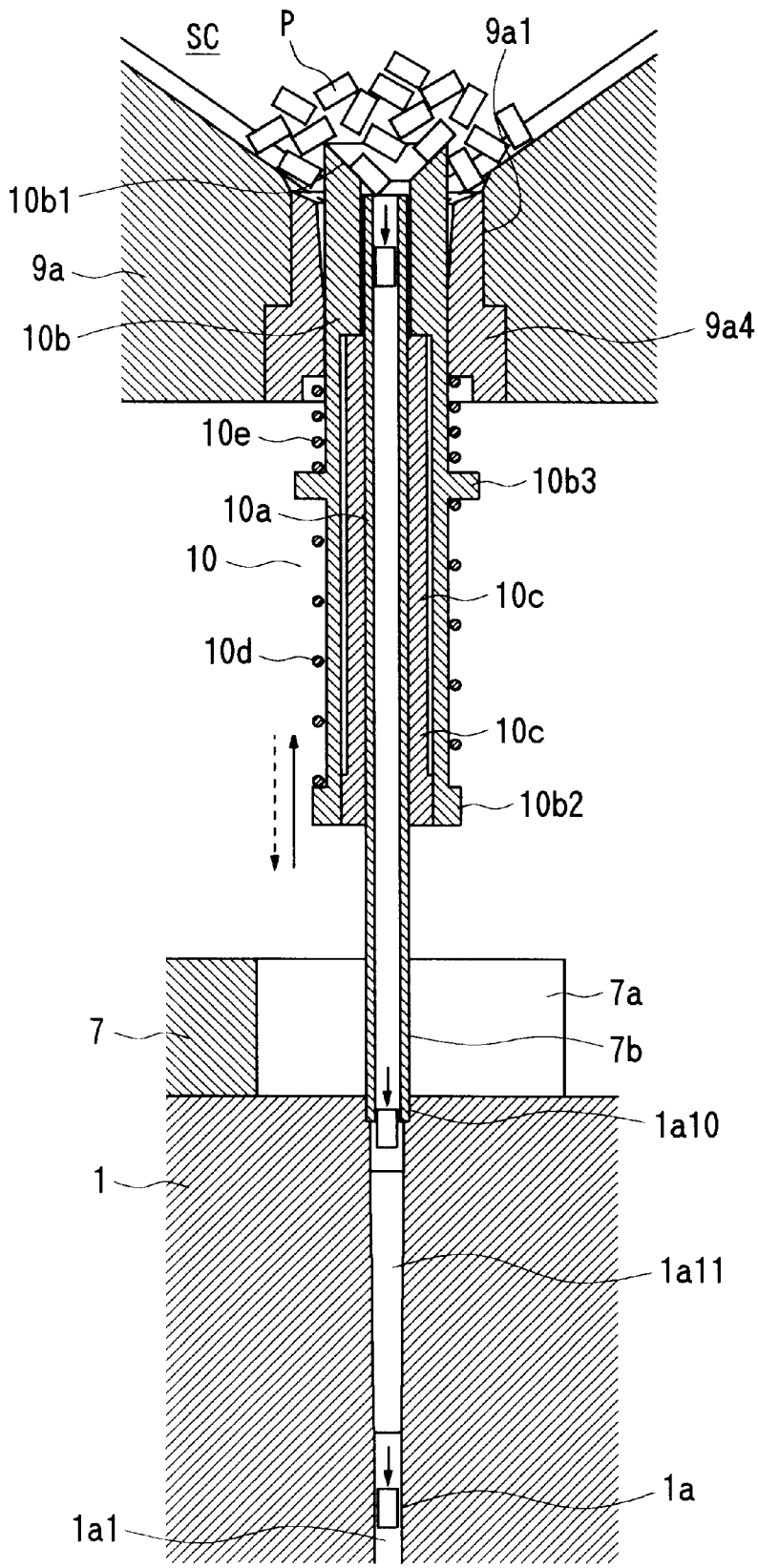
FIG. 23 is an operation-explaining view related to the component replenishment of the component supply apparatus shown in FIG. 14.

Under the state of FIG. 22, the movable pipe 10b is caused to go up against the urge of the second coil spring 10e, and then as shown in FIG. 23, the chip component P in the upper side of the movable pipe 10a is elevated upward, and also the movable pipe 10b is caused to go down from the elevated position, and then the chip component P in the upper side of the movable pipe 10 travels downward.

This upward-downward movement of the movable pipe 10b gives agitation effect to the chip components P inside the component storage case SC, and as a result, the chip components P in the upper side of the movable pipe 10b is taken in into the upper end opening of the component replenish pipe 10a in the longitudinal direction, being guided by the inclination of the guide surface 10b1, or directly.

The chip component P taken in into the component replenish pipe 10a moves downward by its own weight inside the component replenish pipe 10a, and is transferred into inside the component passage 1a from the lower end of the component replenish pipe 10a.

According to the component supply apparatus SY2 shown as the second embodiment, moving the movable pipe 10b of the pipe mechanism upward and downward can cause the chip components P stored in the component storage case 9 to be taken in into the component replenish pipe 10a one by one in the longitudinal direction, and these chip components P can be sequentially transferred into the component passage 1a through the component replenish pipe 10a. That is, the stored components P in the component storage case 9 can be correctly supplied to the component passage 1a to prevent the state of vacancy with no chip components P traveling inside the component passage 1a without fail and to continue the aforementioned component discharge without being interrupted.

The other result and effect of the component supply apparatus SY2 shown as the second embodiment are the same as those of the component supply apparatus SY1 shown as the first embodiment.

Figure 24:
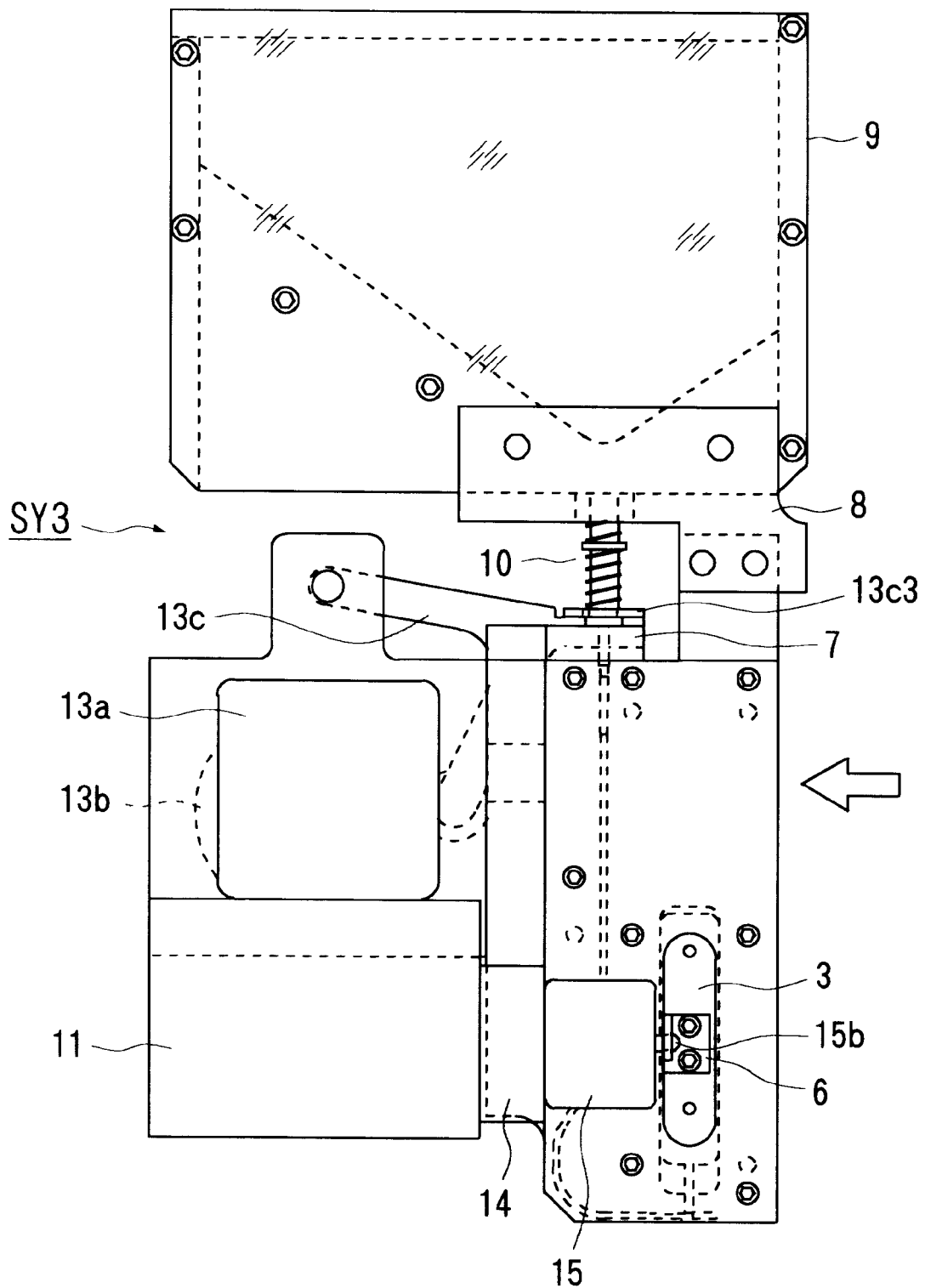
FIG. 24 is a front view of a component supply apparatus related to a third embodiment of the present invention.
Figure 25:
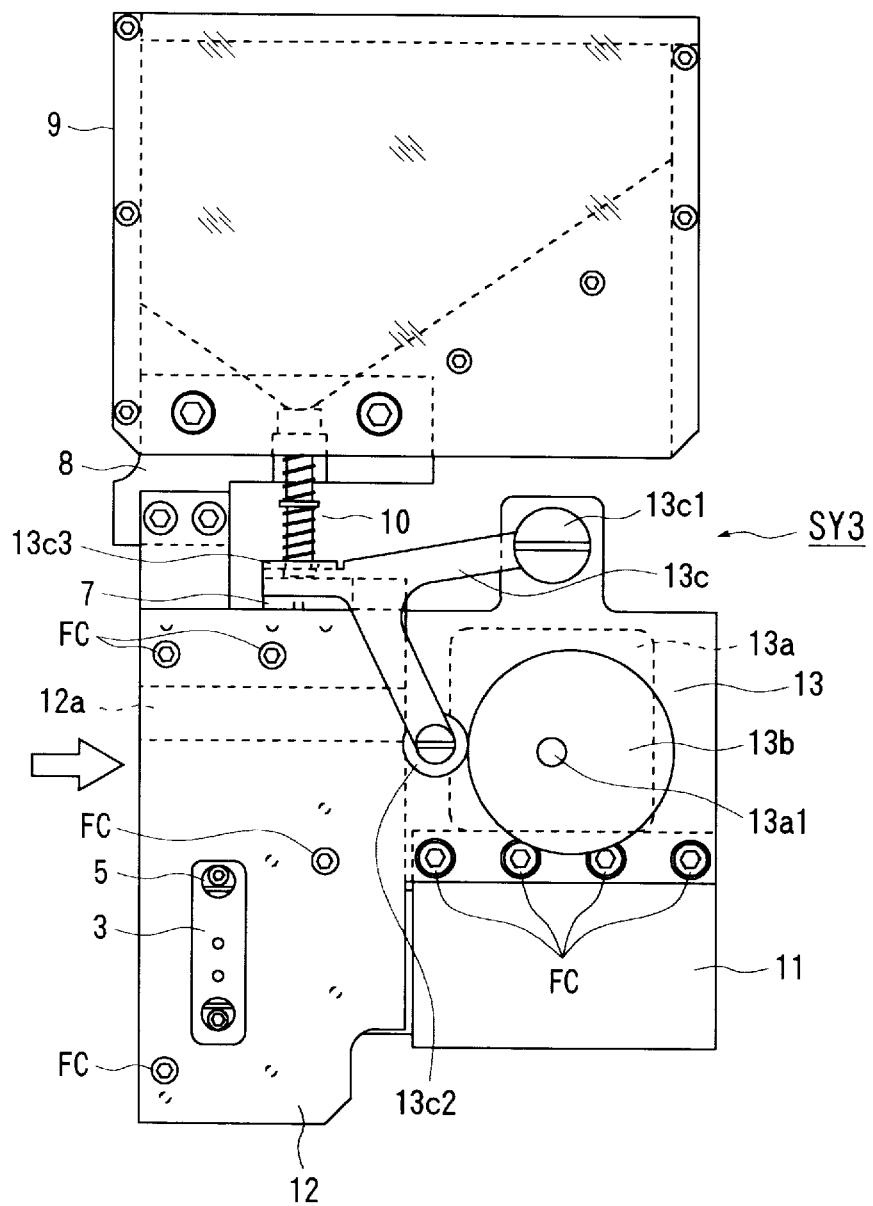
FIG. 25 is a rear view of the component supply apparatus shown in FIG. 24.

FIGS. 24 to 26 show a third embodiment of the present invention. Incidentally, in the following description, for the convenience of the description, the front side in FIG. 24 is expressed as "front," the rear side as "behind," the left side as "left," and the right side as "right."

The component supply apparatus SY3 shown as the third embodiment comprises a base 11, an attachment plate 12, a first actuator for driving the movable pipe, a spacer 14, and a second actuator 15 for driving the pusher plate which are added to the component supply apparatus SY2 shown as the second embodiment. Since configuration of the component supply apparatus SY2 is as described before, description on it is omitted here.

The attachment plate 12 is for supporting the chute plate 1, and four screw insertion holes (without the symbol) in correspondence with the screw holes of the chute plate are through-formed. In addition, the oblong guide protrusion 12a capable of engaging the guide groove 1g disposed on the rear surface of the chute plate 1 is formed on the front surface of the attachment plate 12. This attachment plate 12 is attached on the rear surface of the base 11 with four fixing screws FC.

The first actuator 13 for driving the movable pipe is configured by comprising a motor 13a fixed on the front side of the base 11, a disk-shaped cam 13b fixed to the shaft 13a1 of the motor 13a and located in the rear side of the base 11, and the V-shaped lever 13c having one end 13c1 which is supported by the upper rear surface of the base 11 in a freely rotary fashion.

Figure 26A:
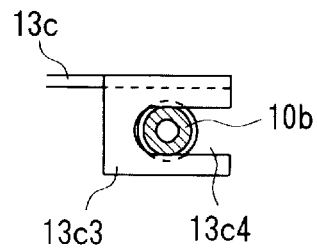
FIG. 26(A) is a top view of a lever engagement piece shown in FIG. 24.

Disposed at the other end of the lever 13c is a roller 13c2, which roller 13c2 contacts the periphery surface of the cam 13b. In addition, the engagement piece 13c3 is provided at the center of the lever 13c, and as shown in FIG. 26(A), a U-shaped cut-off portion 13c4 is formed at this fitting piece 13c3. This cut-off portion 13c4 has a shape extending right and left with its right end being open and with its width being larger than the outer diameter of the movable pipe 10b and smaller than the first collar 10b2.

Figure 26B:
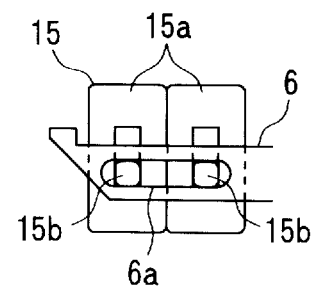
FIG. 26(B) is a right-side view of a second actuator shown in FIG. 24.

The second actuator 15 for driving the pusher plate has the plunger 15b which moves upward and downward by a solenoid and protrude from one surface of the box body 15a having a built-in solenoid (not shown in the drawing). As shown in FIG. 26(B), in the drawn embodiment, two box bodies 15a are disposed in parallel so as to attain the predetermined driving power. This second actuator 15 is attached to the right side surface of the base 11 via a spacer 14.

The component supply apparatus SY2 shown as the second embodiment is mounted on the base 11 by screwing down the fixing screws FC into the screw holes 1i of the chute plate 1 through the screw insertion holes in the attachment plate 12 after having slid the left end of the guide groove 1g disposed in the rear surface of the chute plate 1 in the direction of the white arrow under the state that the apparatus is engaged with the right end of the guide protrusion 12a disposed on the front surface of the attachment plate 12. When to slide the component supply apparatus SY2 in the direction of the outline arrow, the cut-off portion 13c4 of the lever13c of the first actuator 13 is inserted between the first collar 10b2 of the movable pipe 10b and the lower end of the first coil spring 10d. In addition, two plungers 15b of the second actuator 15 are inserted into the holes 6a of the bracket 6 which is mounted on the pusher plate 3. As described in the foregoing, the component supply apparatus SY3 shown in FIGS. 24 and 25 is configured.

The operation of the component supply apparatus SY3 shown as the third embodiment will be described as follows. Since the component moving operation and the component discharge operation in this component supply apparatus SY3 is the same as that of the component supply apparatus SY1 which has been described before, and the component replenish operation is the same as that of component supply apparatus SY2 which has been described before, description on them is omitted here.

The first actuator 13 gives to the movable pipe 10b of the pipe mechanism 10 back and forth movements in the upward and downward direction. When the cam 13b is caused to rotate at 180 degrees on clockwise or on counterclockwise in FIG. 25, the lever 13c rotates at predetermined degrees on clockwise with its one end 13c1 being the center. This rotation of lever elevates the engagement piece 13c3, and the movable pipe 10b is elevated in accordance with this elevation of the engagement piece 13c3. When the cam 13b is caused to further rotate at 180 degrees, the lever 13c rotates at predetermined degrees on clockwise with its one end 13c1 being the center. This rotation of lever descends the engagement piece 13c3, and the movable pipe 10b is descended in accordance with this descent of the engagement piece 13c3.

That is, making the cum 13*b* rotate can cause the movable pipe 10*b* to move back and forth in the upward and downward direction.

The second actuator 15 gives to the pusher plate 3 reciprocation in the upward and downward direction. Excitation of solenoid inside the box body 15*a* elevates the plunger 15*b*, and the pusher plate 3 is elevated in accordance with this elevation of the plunger 15*b*. Removing excitation of solenoid to descend the plunger 15*b* causes the pusher plate 3 to be descended in accordance with this descent of the plunger 15*b*. That is, making the plunger 15*b* move upward and downward can cause the pusher plate 3 to move back and forth in the upward and downward direction.

According to the component supply apparatus SY3 shown as the third embodiment, the first actuator 13 correctly implements the upward and downward movements of the movable pipe 10*b* so as to proceed with the aforementioned component supply operation in certain and stable manner. In addition, the second actuator 15 correctly implements the upward and downward movements of the pusher pipe 3 so as to proceed with the aforementioned component discharge operation in certain and stable manner.

The other result and effect of the component supply apparatus SY3 shown as the third embodiment are the same as those of the component supply apparatus SY2 shown as the second embodiment.

The variation of the permanent magnet in the component supply apparatuses SY1 through SY3 shown as the first through the third embodiments will be described as follows with reference to FIGS. 27 to 29.

Figure 27:
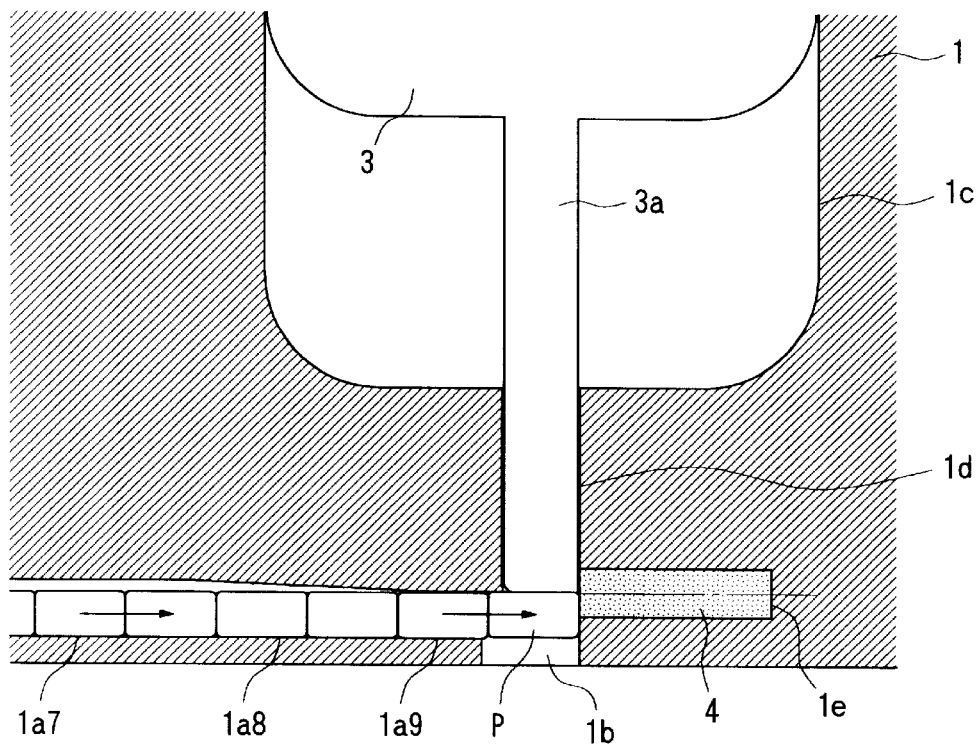
FIG. 27 is a partially longitudinal section of the apparatus showing a modification of a permanent magnet.

A modification shown in FIG. 27 is configured by comprising the same permanent magnet 4 as the aforementioned, wherein the center line connecting its N-pole and S-pole is disposed at a position higher than the central line of the sixth straight portion 1*a*9 of the component passage 1*a*. According to this modification, the magnetic force of the permanent magnet 4 attracts the forefront chip component P inside the component passage 1*a* in the upper right direction in the drawing so as to cause the upper surface of the chip component P to tightly contact the upper surface of the tip of the component passage 1*a* certainly. This results in stabilizing the posture of the forefront chip component P in the discharge stand-by condition and proceeding with the component discharge performance better.

Figure 28:
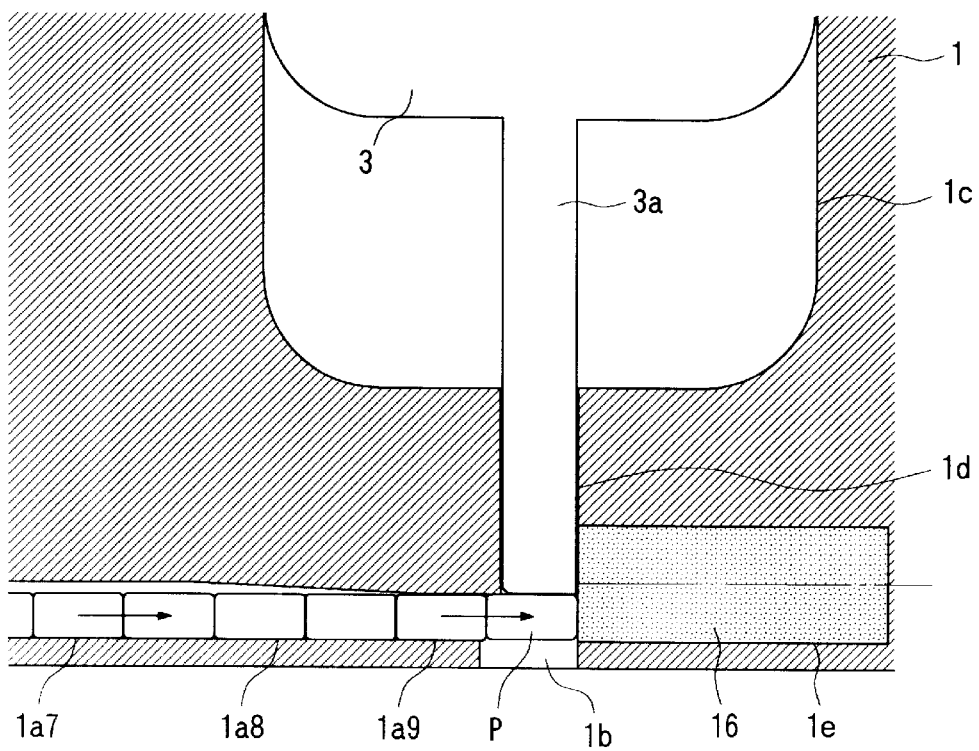
FIG. 28 is a partially longitudinal section of the apparatus showing another modification of the permanent magnet.

A modification shown in FIG. 28 uses the permanent magnet 16 which is bigger in height dimension as well as in length dimension than the permanent magnet 4, and the area of the exposed pole surface of the permanent magnet 16 is larger than the area of the end surface of the tip of the component passage 1*a*. In this connection, with the magnetic force of the permanent magnet 4 being 1200 Gauss, the magnetic force of this permanent magnet 16 is around 3500 Gauss. In addition, the center line connecting its N-pole and S-pole of the permanent magnet 16 is disposed at a position higher than the central line of the sixth straight portion 1*a*9 of the component passage 1*a*. According to this modification, the magnetic force of the permanent magnet 16 attracts the forefront chip component P inside the component passage 1*a* in the upper right direction in the drawing so as to cause the upper surface of the chip component P to tightly contact the upper surface of the tip of the component passage 1*a* certainly. This results in stabilizing the posture of the forefront chip component P in the discharge stand-by condition and proceeding with the component discharge performance better.

Figure 29:
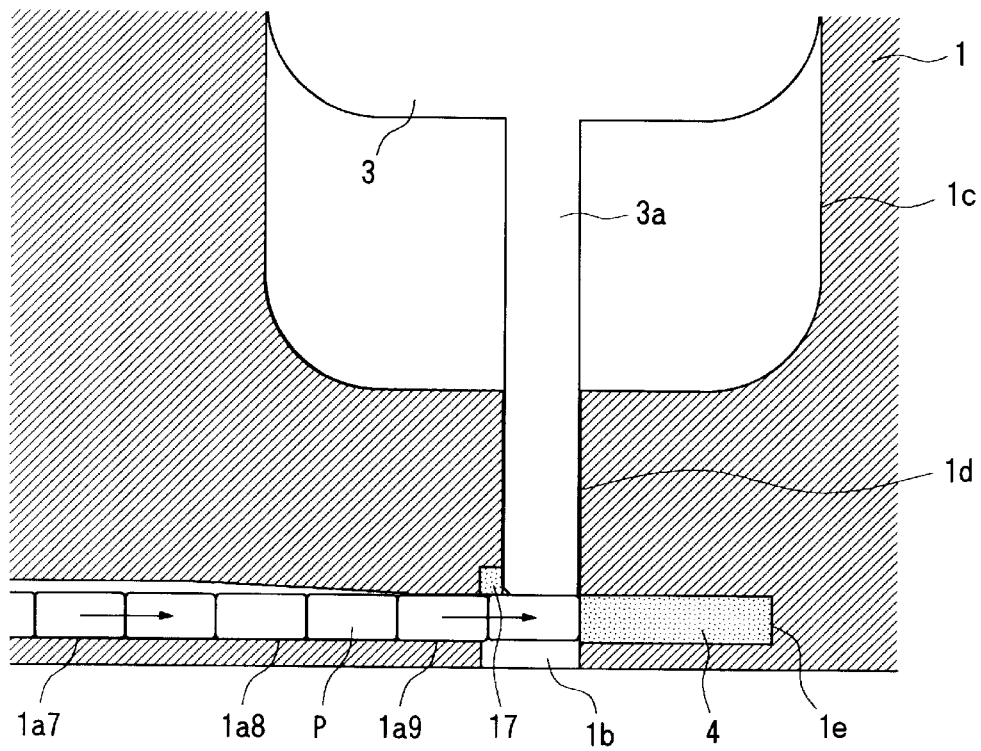
FIG. 29 is a partially longitudinal section of the apparatus showing further another modification of the permanent magnet.

A modification shown in FIG. 29 uses the second permanent magnet 17 which is smaller in size as well as in magnetic force than the permanent magnet 4, and is disposed lower left of the pusher insertion opening 1*d*. In this connection, with the magnetic force of the permanent magnet 4 being 1200 Gauss, the magnetic force of this permanent magnet 17 is around 300 Gauss. According to this modification, making use of the magnetic force of the permanent magnet 17, the forefront chip component P inside the component passage 1*a* can be attracted in the upper right direction in the drawing so as to cause the upper surface of the chip component P to tightly contact the upper surface of the tip of the component passage 1*a* certainly. This results in stabilizing the posture of the forefront chip component P in the discharge stand-by condition and proceeding with the component discharge performance better.

Figure 30:
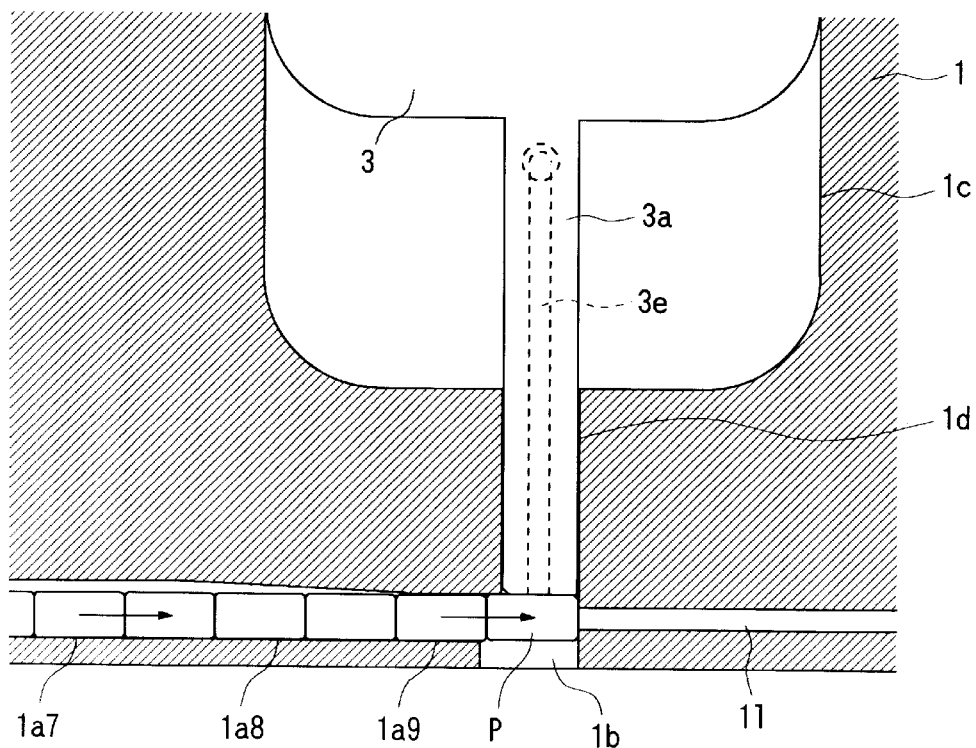
FIG. 30 is a partially longitudinal section of the apparatus showing a modification using an air aspiration hole instead of the permanent magnet.

A modification shown in FIG. 30 is configured by comprising an air suction hole 11 instead of the aforementioned permanent magnet 4, and a tube from an air circuit (not shown for omission) comprising a vacuum pump, etc., is connected with this air suction hole 11. The forefront chip component P which travels downward by its own weight in the component passage 1*a* comes near the air suction hole 11, where the component P is attracted by the suction force of this air suction hole 11, and is suction-held under such a state that its end surface contacts the end surface of the tip of the component passage 1*a*. For the purpose of further stabilizing the posture of the forefront tip component P in the discharge stand-by condition, it is advisable that the air suction hole 3*e* is formed in the tip portion 3*a* of the pusher plate 3 so as to reach its lower surface, and the suction force of this air suction hole 3*e* is made to assist suction-held of the forefront chip component P. Removing the suction force of the air suction hole 3*e* after having proceeded with component discharge with the pusher plate 3 can cut off the tip portion 3*a* and the component without any problem.

The variation of the component passage in the component supply apparatuses SY1 through SY3 shown as the first through the third embodiments will be described as follows with reference to FIGS. 31 to 41.

Figure 31:
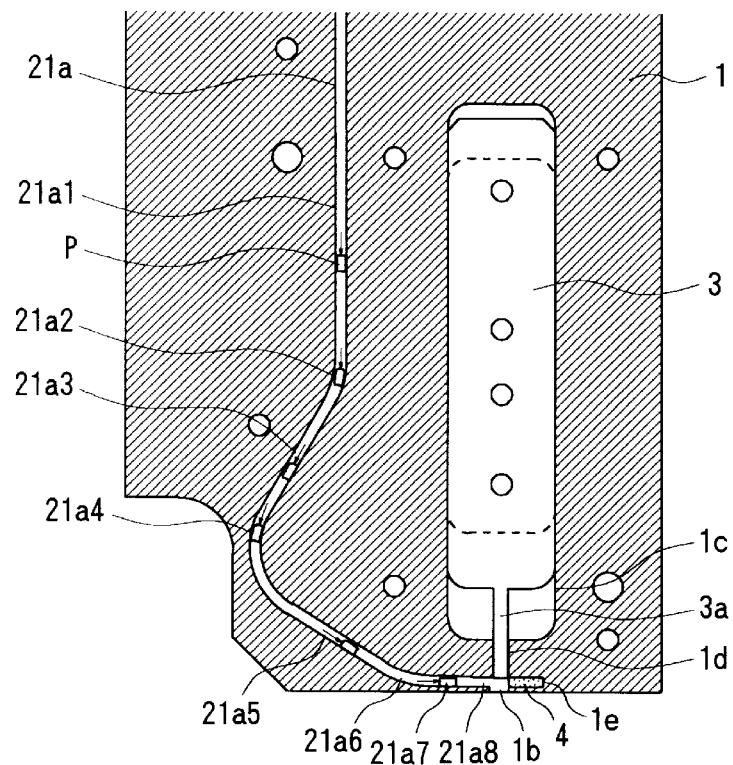
FIG. 31 is a partially longitudinal section of the apparatus showing a modification of a component passage.

A modification shown in FIG. 31 is configured by having adopted a component passage different from the component passage 1*a* of the aforementioned component supply apparatus. As shown in the drawing, the component passage 21*a* is configured by comprising the taper portion (not shown for omission) similar to that in the aforementioned component supply apparatus, the longitudinal first straight portion 21*a*1, the rightward-curved first curved portion 21*a*2, the leftdownward inclined second straight portion 21*a*3, the leftward-curved second curved portion 21*a*4, the rightdownward inclined third straight portion 21*a*5, the downward-curved third curved portion 21*a*6, the lateral fourth straight portion 21*a*7, and the lateral fifth straight portion 21*a*8 which give rise to a shape as arranged in succession in order. The fourth straight portion 21*a*7 is equivalent to the fifth straight portion 1*a*8 of the aforementioned component supply apparatus, and the fifth straight portion 21*a*8 is equivalent to the sixth straight portion 1*a*9 of the aforementioned component supply apparatus. According to this modification, the right-downward inclined third straight portion 21*a*5 is connected with the fourth straight portion 21*a*7 in succession, and therefore, the chip components P can be fed in to the fourth straight portion 21*a*7 as well as to the fifth straight portion 21*a*8 by use of travel by their own weights.

Figure 32:
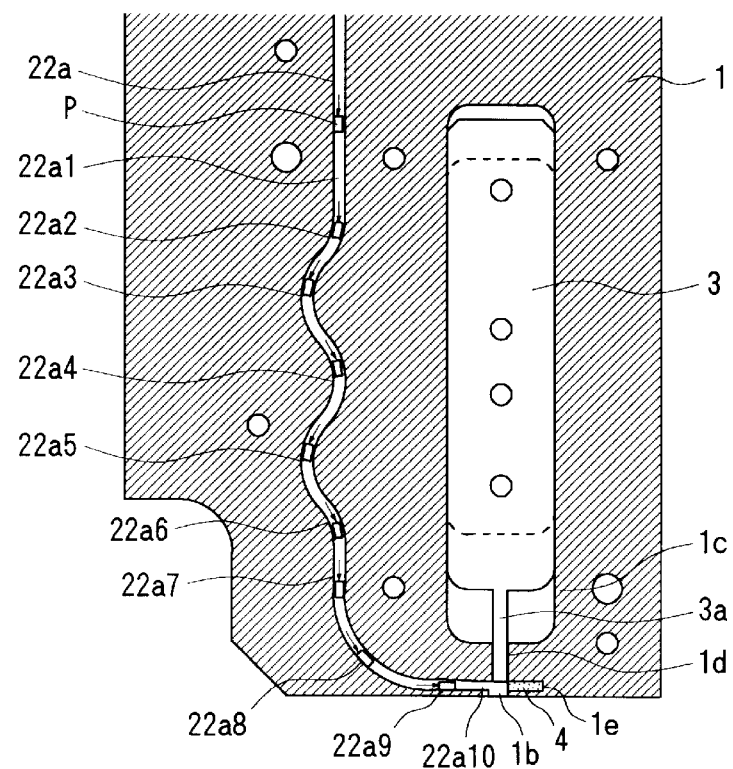
FIG. 32 is a partially longitudinal section of the apparatus showing another modification of the component passage.

A modification shown in FIG. 32 is configured by having adopted a component passage different in shape from the component passage 1*a* of the aforementioned component supply apparatus. As shown in the drawing, the component passage 22a is configured by comprising the taper portion (not shown for omission) similar to that in the aforementioned component supply apparatus, the longitudinal first straight portion 22a1, the rightward-curved first curved portion 22a2, the leftward-curved second curved portion 22a3, the rightward-curved third curved portion 22a4, the left-ward curved fourth curved portion 22a5, the right-ward curved fifth curved portion 22a6, the longitudinal second straight portion 22a7, the left-ward curved sixth curved portion 22a8, the lateral third straight portion 22a9, and the lateral fourth straight portion 22a10 which give rise to a shape as arranged in succession in order. The third straight portion 22a9 is equivalent to the fifth straight portion 1a8 of the aforementioned component supply apparatus, and the fourth straight portion 22a10 is equivalent to the sixth straight portion 1a9 of the aforementioned component supply apparatus. According to this modification, five curved portions 22a2 through 22a6 with the respective direction of curve being alternately different are arranged in succession, and therefore, the postures of descending chip components P can be corrected in succession. In addition, the left-ward curved sixth curved portion 22a8 is connected with the third straight portion 22a9 in succession, and therefore, the chip components P can be fed in to the third straight portion 22a9 as well as to the fourth straight portion 22a10 by use of travel by their own weights.

Figure 33:
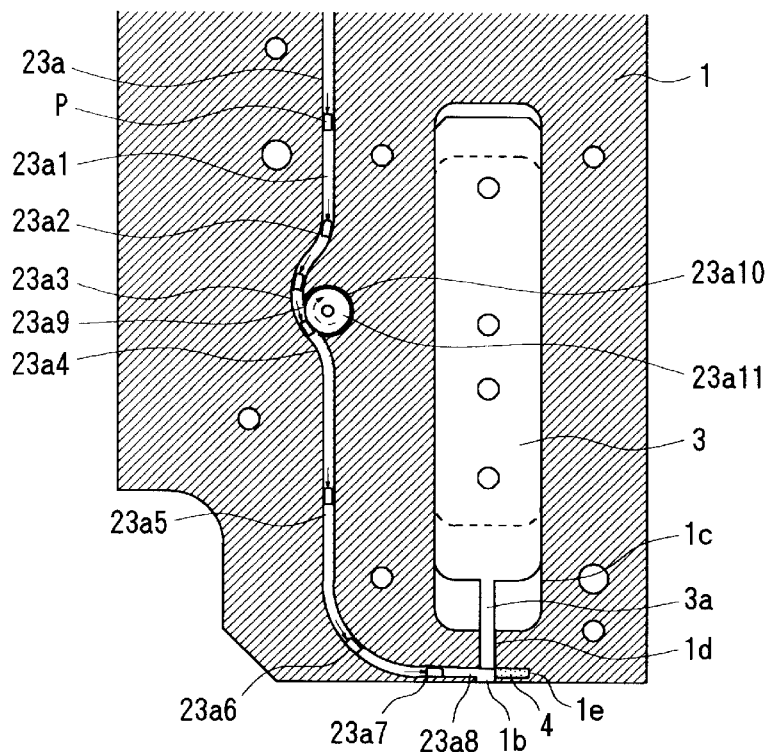
FIG. 33 is a partially longitudinal section of the apparatus showing further another modification of the component passage.

A modification shown in FIG. 33 is configured by having adopted a component passage different in shape from the component passage 1a of the aforementioned component supply apparatus as well as jointly used the posture correcting device to correct the postures of traveling components. As shown in the drawing, the component passage 23a is configured by comprising the taper portion (not shown for omission) similar to that in the aforementioned component supply apparatus, the longitudinal first straight portion 23a1, the rightward-curved first curved portion 23a2, the leftward-curved second curved portion 23a3, the rightward-curved third curved portion 23a4, the longitudinal second straight portion 23a5, the left-ward curved fourth curved portion 23a6, the lateral third straight portion 23a7, and the lateral fourth straight portion 23a8 which give rise to a shape as arranged in succession in order. The third straight portion 23a7 is equivalent to the fifth straight portion 1a8 of the aforementioned component supply apparatus, and the fourth straight portion 23a8 is equivalent to the sixth straight portion 1a9 of the aforementioned component supply apparatus. In addition, an opening 23a9 is formed on the right inner surface of the second curved portion 23a3, and circular recessed portion 23a10 is formed adjacent to this opening 23a9. Moreover, inside this circular recessed portion 23a10, the roller 23a11 is disposed in a freely rotary fashion, and a portion of the periphery surface of the roller 23a11 is exposed in the passage through the opening 23a9 so as to be capable of contact with the traveling components. According to this modification, among the chip components P passing through the second curved portion 23a3, the chip components P which rose to disorder in posture can be brought into contact with the periphery surface of the roller 23a11 to correct their postures. The roller 23a11 may be the one which rotates due to contact with the chip components P, or may be forced to rotate in the direction of the arrow in the drawing, using an actuator such as motor, etc.

Figure 34:
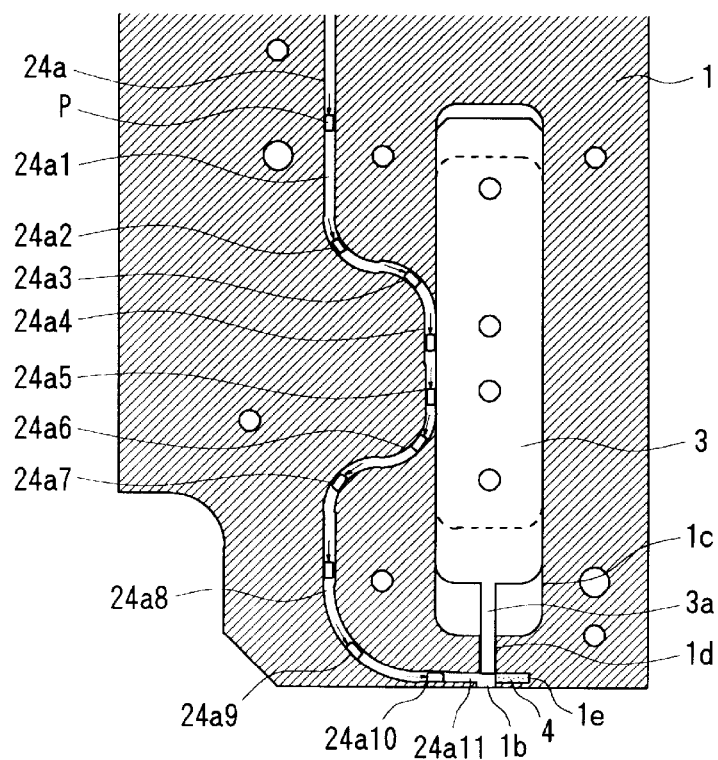
FIG. 34 is a partially longitudinal section of the apparatus showing further another modification of the component passage.

A modification shown in FIG. 34 is configured by having adopted a component passage different in shape from the component passage 1a of the aforementioned component supply apparatus as well as jointly used the posture correcting device to correct the postures of traveling components.

As shown in the drawing, the component passage 24a is configured by comprising the taper portion (not shown for omission) similar to that in the aforementioned component supply apparatus, the longitudinal first straight portion 24a1, the leftward-curved first curved portion 24a2, the rightward-curved second curved portion 24a3, the longitudinal second straight portion 24a4, the longitudinal third straight portion 24a5, the rightward-curved third curved portion 24a6, the leftward-curved fourth curved portion 24a7, the longitudinal fourth straight portion 24a8, the leftward-curved fifth curved portion 24a9, the lateral fifth straight portion 24a10, and the lateral sixth straight portion 24a11 which give rise to a shape as arranged in succession in order. The fifth straight portion 24a10 is equivalent to the fifth straight portion 1a8 of the aforementioned component supply apparatus, and the sixth straight portion 24a11 is equivalent to the sixth straight portion 1a9 of the aforementioned component supply apparatus. In addition, the second straight portion 24a4 and the third straight portion 24a5 are located along the pusher moving cavity 1c, and an opening (without a symbol) connect in succession to the pusher moving cavity 1c is formed on the right inner surfaces of the both straight portions. A portion of the left side surface of the pusher plate 3 is exposed in the passage through the opening so as to enable contact with the traveling components. Moreover, the thickness dimension of the third straight portion 24a5 is formed slightly smaller than the thickness dimension of the second straight portion 24a4, the left side surfaces of the both portions are in succession via the inclined surface (without any symbol). According to this modification, among the chip components P passing through the second curved portion 24a4 and the third straight portion 24a5, the chip components P which rose to disorder in posture can be brought into contact with the left side surface of the pusher plate 3 which travels upward and downward in accordance with component discharge, to correct their postures, and the chip components after the posture correction can be taken in into the third straight portion 24a5 having small thickness dimension. Since the upward and downward traveling of the pusher plate 3 in accordance with component discharge is made use of, an actuator is not separately required to make the aforementioned roller rotate compulsorily. In addition, since the thickness dimension of the third straight portion 24a5 is formed slightly smaller than the thickness dimension of the second straight portion 24a4, the posture of the chip component P after posture correction can be maintained.

Figure 35:
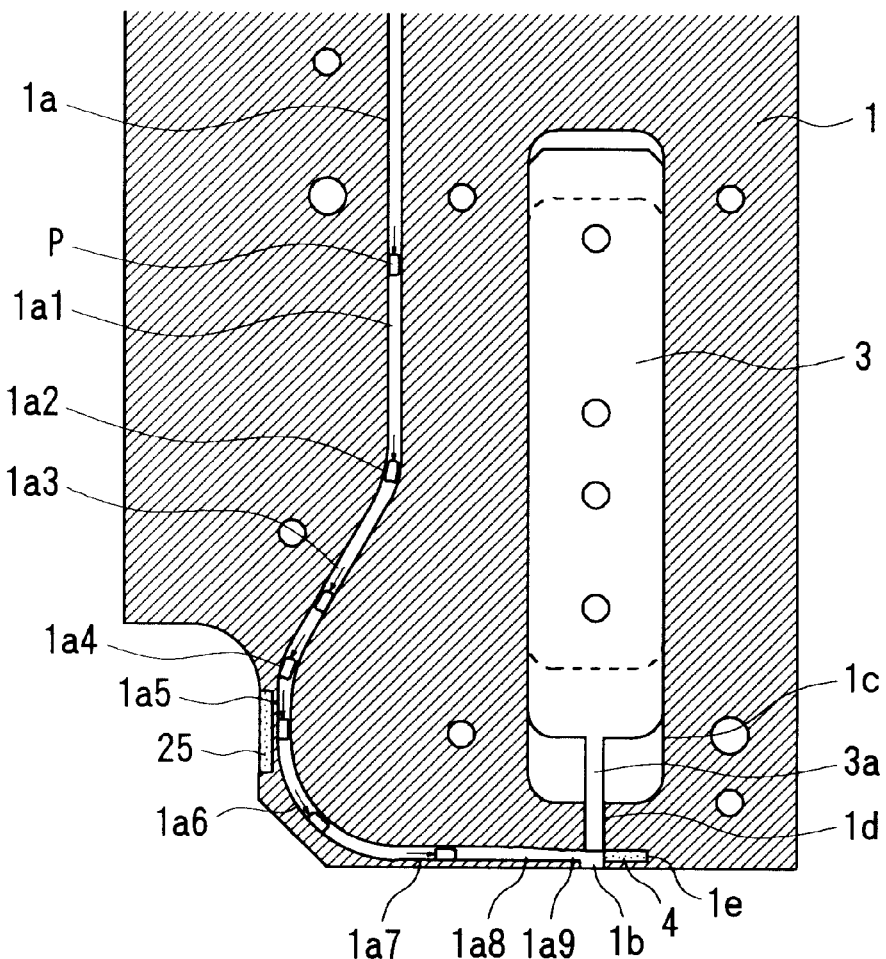
FIG. 35 is a partially longitudinal section of the apparatus showing further another modification of the component passage.

A modification shown in FIG. 35 is configured by comprising a permanent magnet for posture correction which is disposed along the component passage 1a of the aforementioned component supply apparatus. As shown in the drawing, the permanent magnet 25, which has the N-pole and the S-pole at the both parties in the left-right direction, is laid under the chute plate 1 so that the pole surface either of the N-pole and S-pole faces the third straight portion 1a5. The attraction force due to the magnetic force of this permanent magnet 25 is set at a small force so as not to prevent the chip components P from traveling by their own weights in the third straight portion 1a5 for the purpose of making the attracted chip component P avoid lingering in the third straight portion 1a5. According to this modification, the magnetic force of the permanent magnet 25 can attract the chip component P passing through the third straight portion 1a5 to the left inner surface of the third straight portion 1a5 so as to correct the posture of the chip component P.

Figure 36A:
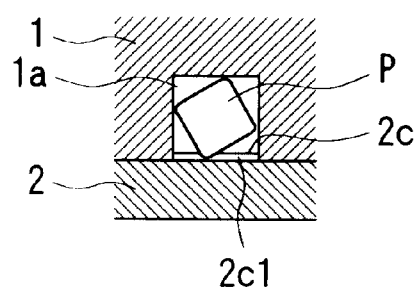
FIG. 36(A) and FIG. 36(B) are respectively a partially longitudinal section of the apparatus showing further another modification of the component passage and a partially perspective view of a cover plate.
Figure 36B:
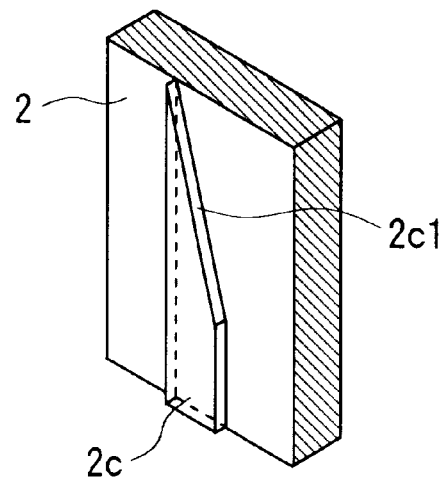

A modification shown in FIG. 36(A) and FIG. 36(B) is the one wherein an idea has been extended to a portion of the component passage 1*a* of the aforementioned component supply apparatus. As shown in the drawing, the band-shaped protrusion 2*c* is formed on one surface of the cover plate 2 so as to have the dimension in correspondence with the thickness dimension of the passage 1*a*, and the step 2*c*1 for posture correction crossing obliquely the component passage 1*a* is formed on this band-shaped protrusion 2*c*. The quantity of protrusion of the band-shaped protrusion 2*c* into the component passage 1*a* is set to a degree that will not prevent the chip component P from traveling in the component passage 1*a*. This band-shaped protrusion 2*c* is provided so as to be located in the longitudinal straight portion of the component passage 1*a* of the aforementioned component supply apparatus. According to this modification, among the chip components P passing through the longitudinal straight portion of the component passage 1*a*, the chip components P which rose to disorder in posture as in FIG. 9(A) can be brought into contact with the step 2*c*1 to correct their postures during the course of traveling of components, making use of inclination of this step 2*c*1.

Figure 37A:
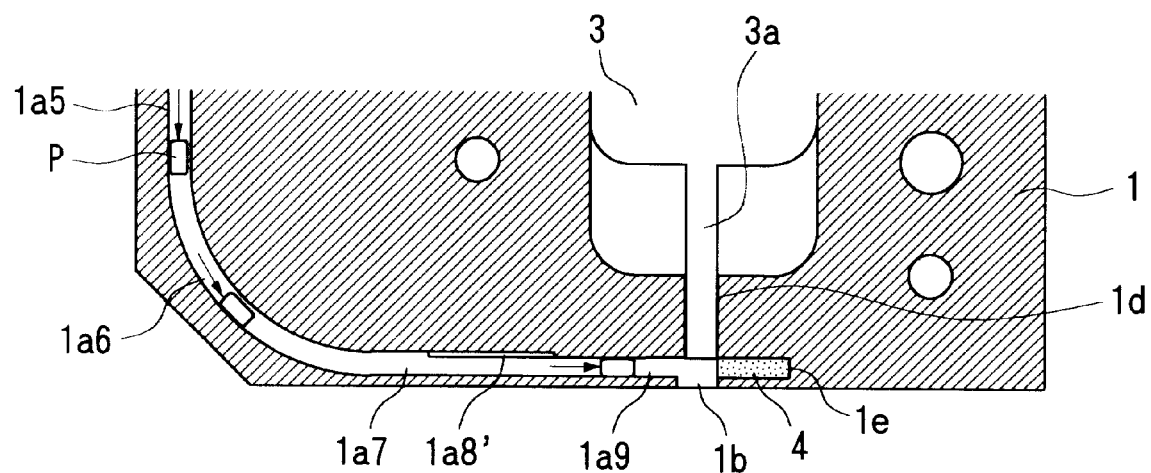
FIG. 37(A) and FIG. 37(B) are respectively a partially longitudinal section of the apparatus showing further another modification of the component passage and a partially perspective view of a chute plate.
Figure 37B:
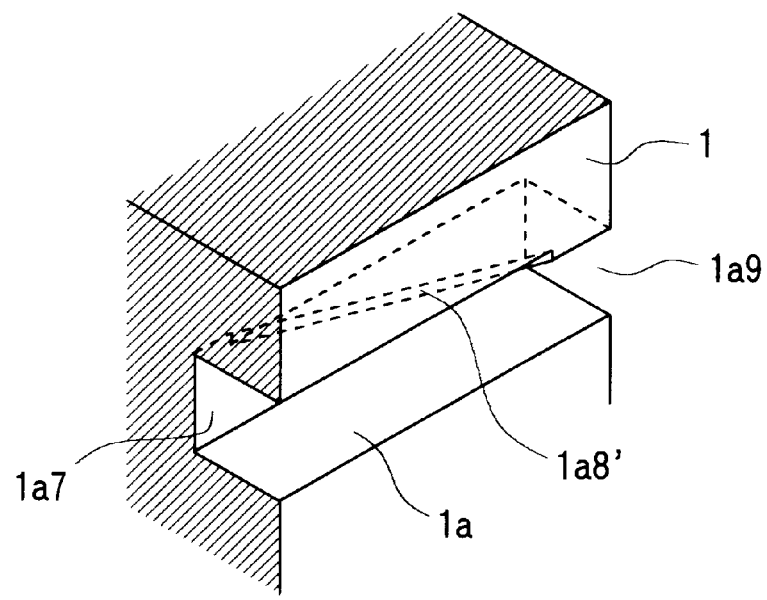

A modification shown in FIG. 37(A) and FIG. 37(B) is the one wherein an idea has been extended to a portion of the component passage 1*a* of the aforementioned component supply apparatus. As shown in the drawing, on the upper surface between the fourth straight portion 1*a*7 and the sixth straight portion 1*a*9 of the component passage 1*a*, the step 1*a*8' for posture correction crossing obliquely the component passage 1*a* is formed so as to be equivalent to the difference in the thickness dimension of the fourth straight portion 1*a*7 and the sixth straight portion 1*a*9. According to this modification, among the chip components P passing through the fourth straight portion 1*a*7 of the component passage 1*a*, the chip components P which rose to disorder in posture can be brought into contact with the step 1*a*8' to correct their postures during the course of traveling of components, making use of inclination of this step 1*a*8'.

Figure 38:
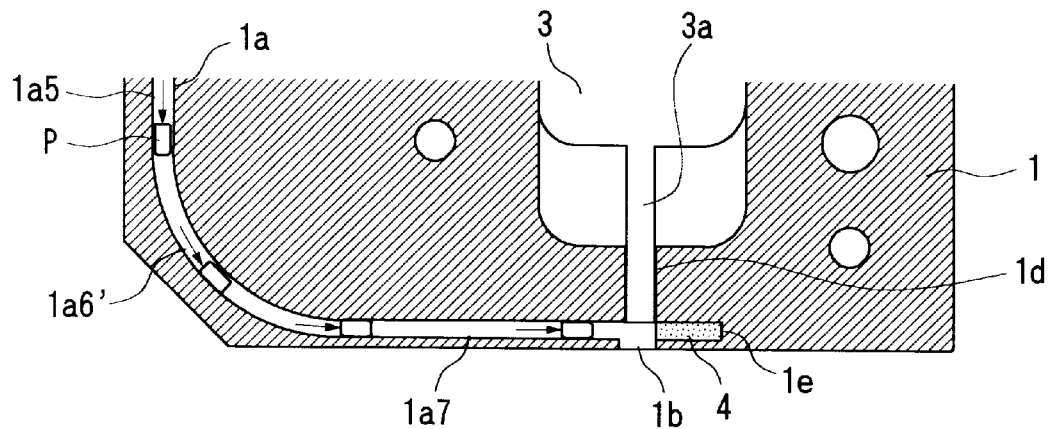
FIG. 38 is a partially longitudinal section of the apparatus showing further another modification of the component passage.

A modification shown in FIG. 38 is the one wherein an idea has been extended to a portion of the component passage 1*a* of the aforementioned component supply apparatus. As shown in the drawing, the thickness dimension of the third curved portion 1*a*6' of the component passage 1*a* gets gradually smaller from the third straight portion 1*a*5 toward the fourth straight portion 1*a*7. In addition, the thickness dimension of the fourth straight portion 1*a*7' is correspondent with the thickness dimension of the third curved portion 1*a*6'. In this connection, the thickness dimension of the fourth straight portion 1*a*7' is the same as that of the sixth straight portion 1*a*9 in the aforementioned component supply apparatus. In this modification, adopting the aforementioned third curved portion 1*a*6' and the fourth straight portion 1*a*7' results in excluding the fifth straight portion 1*a*8 and the sixth straight portion 1*a*9. According to this modification, even when position disorder has given rise to the chip components P which entered the third curved portion 1*a*6', the posture of these chip components P can be corrected by making use that the thickness dimension of the third curved portion 1*a*6' gradually changes with a small amount.

Figure 39A:
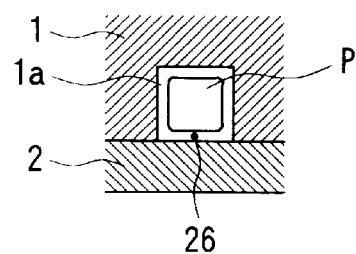
FIG. 39(A) and FIG. 39(B) are respectively a partially cross-sectional view of the apparatus showing further another modification of the component passage and a partially perspective view of the apparatus.
Figure 39B:
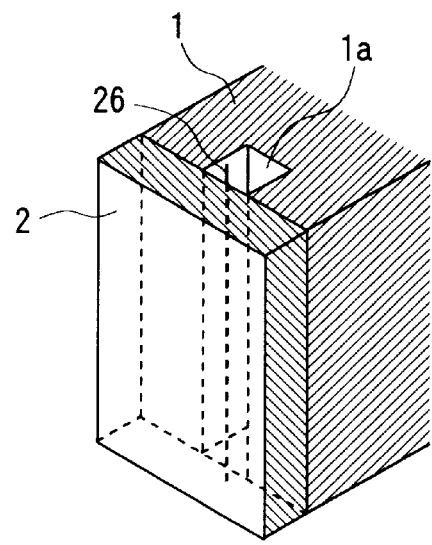

A modification shown in FIGS. 39(A) and 39(B) is configured by comprising a thin line for posture correction which has been disposed in the component passage 1*a* of the aforementioned component supply apparatus. As shown in the drawing, the thin line 26 is configured of bending line material having diameter of around 100 μm with its upper end being fixed at the apparatus side. The other end of the thin line 26 may be either fixed or not fixed, and the thin line 26 may be straight or more or less winding. This thin line 26 is disposed along the center of one inner surface of four inner surfaces of the component passage 1*a*. According to this modification, even when position disorder has given rise to the chip components P which pass through the longitudinal straight portion of the component passage 1*a*, the posture of these chip components P can be corrected by contact with the thin line 26.

Figure 40A:
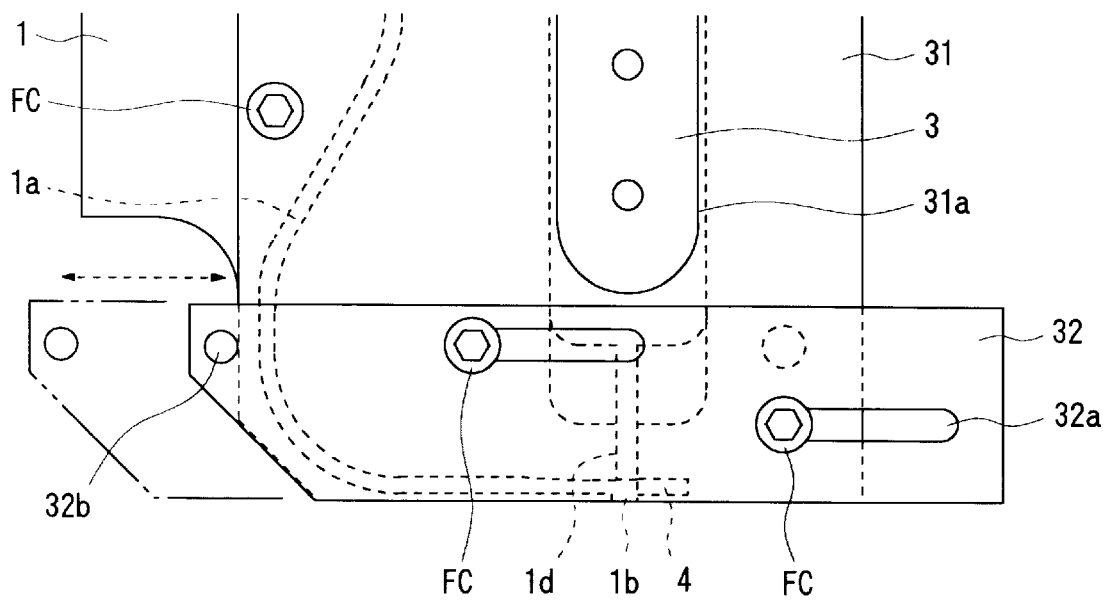
FIG. 40(A) and FIG. 40(B) are respectively a partially front view of the apparatus showing further another modification of the component passage and a drawing showing a state where the lower cover plate has been removed.
Figure 40B:
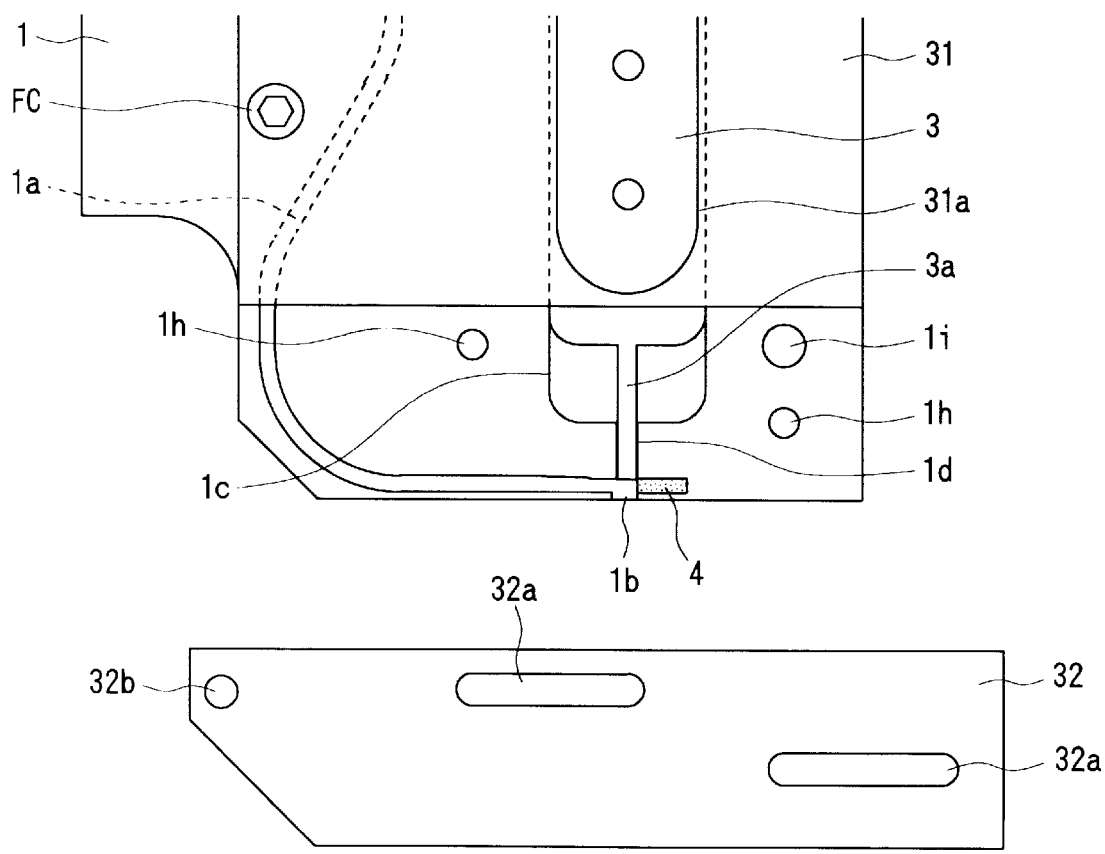

A modification shown in FIG. 40(A) and FIG. 40(B) is the one wherein an idea has been extended to the cover plate configured by the component passage 1*a* of the aforementioned component supply apparatus. As shown in the drawing, the cover plate is configured by comprising the upper cover plate 31 and the lower cover plate 32, with the upper cover plate 31 being fixed to the chute plate 1. The lower cover plate 32 has two oblong holes 32*a*, and comprises the stopper pin 32*b* protruding at the rear side of the left end portion. This lower cover plate 32 is fixed to the chute plate 1 by screwing down the fixing screws FC into the screw holes 1*h* in the chute plate 1 through respective oblong holes 32*a*. Under the state shown in FIG. 40(A), the upper cover plate 31 and the lower cover plate 32 are tightly joined and the stopper pin 32*b* contacts the left side surface of the chute plate 1. This cover plate 32 is configured so as to be capable of sliding in the left-right direction along the oblong hole 32*a* by loosening the fixing screws FC. According to this modification, even if component clogging should occur at the component discharge opening 1*b* and near the discharge opening of the component passage 1*a*, sliding the aforementioned lower cover plate 32 to left and right can remove this component clogging. Of course, when sliding the aforementioned lower cover plate 32 to left and right cannot remove component clogging, it is also possible to get rid of the clogged component from the component passage 1*a* by taking off the lower cover plate 32. In addition, adopting a transparent lower cover plate 32 enables visual observation on the status of the aforementioned component clogging from outside.

Figure 41:
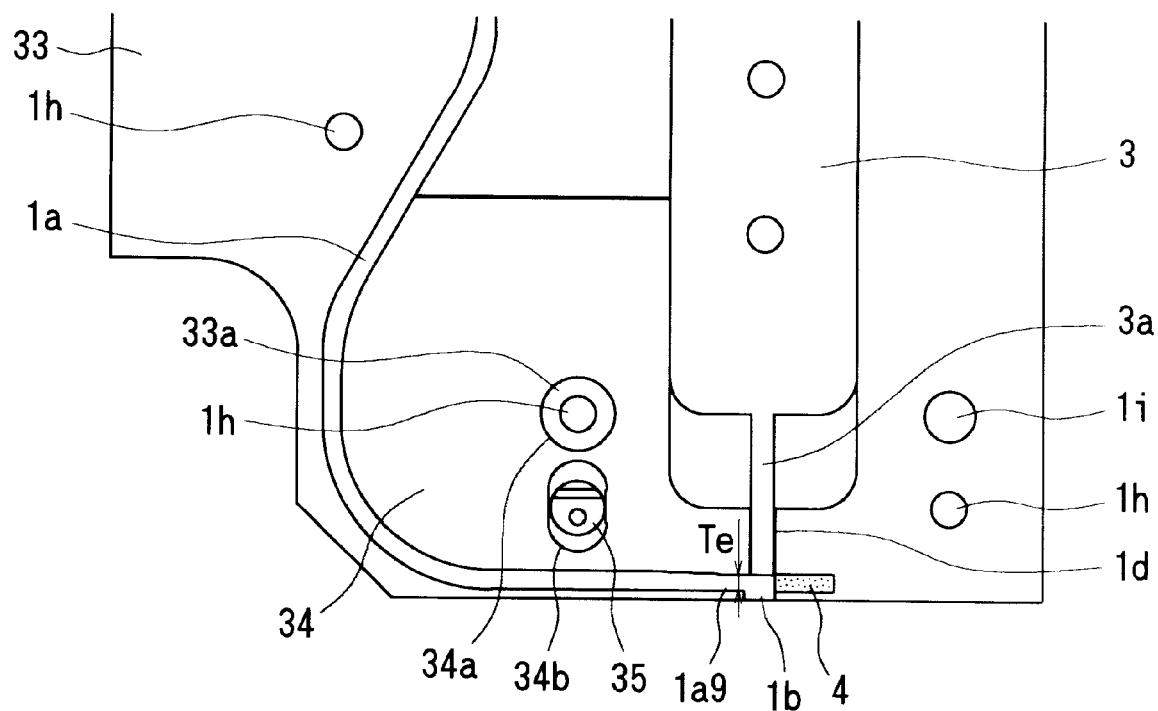
FIG. 41 is respectively a partially front view of the chute plate showing further another modification of the component passage.

A modification shown in FIG. 41 is the one wherein an idea has been extended to the chute plate configuring the component passage 1*a* of the aforementioned component supply apparatus. As shown in the drawing, the chute plate 33 is configured by comprising the movable plate 34 separate from the chute plate 33 in the inner surface of the component passage 1*a* near the discharge opening in the direction of thickness. The lower left side screw hole 1*h* of the chute plate 33 is formed in the cylinder portion 33*a*, and a circular hole 34*a* is formed in the movable plate 34 so as to fit in into this cylinder portion 33*a* in a freely rotary fashion. In addition, a longitudinal hole 34*b* is formed in the movable plate 34, and in this longitudinal hole 34*b*, the adjustment stopper 35 is disposed to make the movable plate 34 rotate to a slightest extent around the circular hole 34*a* as the center. This adjustment stopper 35 comprises a disk having a screw insertion hole at an eccentric position, and is attached to the chute plate 33. According to this modification, making the adjustment stopper 35 rotate appropriately so as to make the movable plate 34 rotate to a slightest extent around the circular hole 34*a* as the center enables to adjust the thickness dimension Te of the foremost portion of the component passage 1*a* in correspondence with the chip component P. That is, it is possible to accurately adjust the thickness dimension Te of the foremost portion of the component passage 1*a* so as to adapt to the thickness dimension Te of the chip component P.

The preferred embodiments and modifications described in the present specification are illustrative and not restrictive. Scope of the present invention is described by way of the attached claims, and all the variations covered by those claims in terms of meaning will be included in the present invention.

What is claimed is:

1. An electronic component supply apparatus comprising:
   a component passage having rectangular cross-section which allows a plurality of components to be housed in a state of being arranged in a longitudinal direction and allows the housed electronic components to be moved downward by their own weights;
   a rectangular-shaped component discharge opening having the same width as the component passage, said component discharge opening being formed at a first side surface of a tip of the component passage;
   a rectangular-shaped pusher insertion opening having the same width as the component passage, said pusher insertion opening being formed at a second side surface opposing the first side surface of the tip of the component passage; and
   a movable pusher having a tip portion fitted with the pusher insertion opening,
   wherein a surface of the component discharge opening located at the same side of an end surface of the tip of the component passage and a surface of the pusher insertion opening located at the same side of the end surface of the tip of the component passage are on the same plane as the end surface of the tip of the component passage.

2. The electronic component supply apparatus according to claim 1, wherein
   the electronic components have manufacturing tolerances,
   a length of the component discharge opening is slightly larger than a maximum length of the electronic component, and
   a length of the pusher insertion opening is slightly smaller than a minimum length of the electronic component.

3. The electronic component supply apparatus according to claim 1, wherein
   the component passage has a shape that a longitudinal portion, a curved portion, and a lateral portion are continued in order,
   the component discharge opening is formed at a lower surface of the tip of the component passage, and the pusher insertion opening is formed at an upper surface of the tip of the component passage, and
   a component holding device is provided so as to hold a forefront electronic component in the component passage in a discharge stand-by condition on the end surface of the tip of the component passage.

4. The electronic component supply apparatus according to claim 3, wherein
   the component holding device is a permanent magnet capable of absorbing the forefront electronic component with magnetic force, and
   one pole surface of said permanent magnet is on the same plane as the end surface of the tip of the component passage.

5. The electronic component supply apparatus according to claim 4, wherein
   the permanent magnet is disposed so that a center line connecting its N-pole and S-pole is in accord with a center line of the tip of the component passage.

6. The electronic component supply apparatus according to claim 4, wherein
   the permanent magnet is disposed so that a center line connecting its N-pole and S-pole is positioned higher than a center line of the tip of said component passage.

7. The electronic component supply apparatus according to claim 4, wherein
   an area of one pole surface of the permanent magnet which is on the same plane as the end surface of the tip of the component passage is larger than an area of the end surface of the tip of the component passage.

8. The electronic component supply apparatus according to claim 1, further comprising:
   a component storage case capable of storing a number of electronic components; and
   a component replenish pipe to take in electronic components in the component storage case one by one in a longitudinal direction and transfer the electronic components into the component passage.

9. The electronic component supply apparatus according to claim 8, further comprising
   a movable pipe for accelerating action of taking in the components from the component storage case into the component replenish pipe, said movable pipe being disposed outside the component replenish pipe so as to be capable of upward and downward moving.

10. The electronic component supply apparatus according to claim 9, further comprising:
    a first actuator to make the pusher move upward and downward; and
    a second actuator to make the movable pipe move upward and downward.

11. The electronic component supply apparatus according to claim 10, wherein
    said first actuator includes a plunger which reciprocates with a solenoid, and
    said second actuator includes a lever which reciprocates with a cam driven by a motor.

12. An electronic component supply apparatus comprising:
    a component passage having rectangular cross-section which allows a plurality of electronic components to be housed in a state of being arranged in a longitudinal direction and allows the housed electronic components to be moved downward by their own weights;
    a component discharge opening formed at a first side surface of a tip of the component passage;
    a pusher insertion opening formed at a second side surface opposing the first side surface of the tip of the component passage; and
    a movable pusher in a tip portion fitted with the pusher insertion opening,
    wherein the component passage has in halfway of the passage at least two curved portions which have different curving directions each other, and said curved portions have approximately the same rectangular cross-section as the component passage.

13. The electronic component supply apparatus according to claim 12, wherein
    the curved portions are sandwiched by two straight portions.

14. The electronic component supply apparatus according to claim 12, wherein
    the curved portion is in succession with another curved portion.

15. The electronic component supply apparatus according to claim 12, wherein the component passage has a lateral straight portion at a foremost of the passage, the component discharge opening is formed at a lower surface of the tip of said lateral straight portion, and the pusher insertion opening is formed at an upper surface of the tip of said lateral straight portion, and a component holding device is provided so as to hold a forefront electronic component in the component passage in a discharge stand-by condition on the end surface of the tip of the lateral straight portion.

16. The electronic component supply apparatus according to claim 15, wherein said component holding device is a permanent magnet capable of absorbing the forefront electronic component with magnetic force, and one pole surface of said permanent magnet is on the same plane as the end surface of the tip of the lateral straight portion.

17. The electronic component supply apparatus according to claim 12, wherein an opening is partially formed on at least one surface of the component passage, and at said opening, a posture correcting device is exposed to correct posture of the electronic component by contact with the moving electronic components inside the component passage.

18. The electronic component supply apparatus according to claim 17, wherein the posture correcting device is a roller having a periphery surface capable of contacting the electronic component.

19. The electronic component supply apparatus according to claim 17, wherein the posture correcting device is the pusher plate having a side surface capable of contacting the electronic component.

20. The electronic component supply apparatus according to claim 12, wherein a component attracting device for posture correction is provided to attract the electronic component moving inside the component passage toward at least one surface of the component passage with such a force which allows the electronic component to be moved by own weight.

21. The electronic component supply apparatus according to claim 20, wherein the component attracting device is a permanent magnet capable of attracting the electronic components with magnetic force, and one pole surface of said permanent magnet is opposing the inner surface of the component passage.

22. The component supply apparatus according to claim 12, wherein a step for posture correction is partially provided on at least one inner surface of the component passage which protrudes inside the passage and cross the passage obliquely.

23. The electronic component supply apparatus according to claim 22, wherein the component passage has a lateral straight portion at a foremost of the passage, and the step for posture correction is provided in the foremost lateral straight portion.

24. The electronic component supply apparatus according to claim 12, wherein the component passage is partially provided with a region for posture correction where at least thickness of a width and a thickness becomes small gradually.

25. The electronic component supply apparatus according to claim 24, wherein the component passage has a lateral straight portion at a foremost of the passage, and the region for posture correction is provided in the foremost lateral straight portion.

26. The electronic component supply apparatus according to claim 12, wherein a thin line for posture correction is disposed along in the component passage to correct posture of the electronic component by contact with the moving electronic components inside the component passage.

27. The electronic component supply apparatus according to claim 12, wherein the component passage has a lateral straight portion at a foremost of the passage, and at least one inner surface of the passage in a predetermined region including said lateral straight portion is configured by a removable slide cover.

28. The electronic component supply apparatus according to claim 12, wherein the component passage has a lateral straight portion at a foremost of the passage, and at least one inner surface of the passage in a predetermined region including said lateral straight portion is configured by movable member which allows a thickness of the lateral straight portion to be varied.

29. The electronic component supply apparatus according to claim 12, further comprising:

a component storage case capable of storing a number of electronic components; and a component replenish pipe to take in electronic components in the component storage case one by one in a longitudinal direction and transfer the electronic components into the component passage.

30. The electronic component supply apparatus according to claim 29, further comprising a movable pipe for accelerating action of taking in the components from the component storage case into the component replenish pipe, said movable pipe being disposed outside the component replenish pipe so as to be capable of upward and downward moving.

31. The electronic component supply apparatus according to claim 30, further comprising:

a first actuator to make the pusher move upward and downward; and a second actuator to make the movable pipe move upward and downward.

32. The electronic component supply apparatus according to claim 31, wherein said first actuator includes a plunger which reciprocates with a solenoid, and said second actuator includes a lever which reciprocates with a cam driven by a motor.

* * * * *